(12) United States Patent
Onozuka et al.

(10) Patent No.: US 7,081,642 B2
(45) Date of Patent: Jul. 25, 2006

(54) ACTIVE MATRIX SUBSTRATE DISPLAY DEVICE

(75) Inventors: Yutaka Onozuka, Yokohama (JP); Mitsuo Nakajima, Yokohama (JP); Yujiro Hara, Yokohama (JP); Tsuyoshi Hioki, Yokohama (JP); Masahiko Akiyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/085,150

(22) Filed: Mar. 22, 2005

(65) Prior Publication Data

US 2005/0167665 A1 Aug. 4, 2005

Related U.S. Application Data

(63) Continuation of application No. 10/392,840, filed on Mar. 21, 2003, now Pat. No. 6,885,030.

(30) Foreign Application Priority Data

Mar. 28, 2002 (JP) .............................. 2002-091546

(51) Int. Cl.
*H01L 31/112* (2006.01)
(52) U.S. Cl. .............................. 257/66; 257/66; 257/69
(58) Field of Classification Search .................. 257/66, 257/67, 69
See application file for complete search history.

(56) References Cited

U.S. PATENT DOCUMENTS 5,339,180 A  8/1994 Katoh
5,763,904 A  6/1998 Nakajima et al.
5,998,804 A * 12/1999 Suh et al. ..................... 257/40
2001/0020994 A1  9/2001 Kaneko et al.

FOREIGN PATENT DOCUMENTS

JP  8-95062  4/1996
JP  11-142878  5/1999
JP  2001-7340  1/2001

OTHER PUBLICATIONS

C. Camperi-Ginestet, et al., "Alignable Epitaxial Liftoff of GaAs Materials with Selective Deposition Using Polyimide Diaphragms", IEEE Transactions Photonics Technology Letters, vol. 3, No. 12, Dec. 1991, pp. 1123-1126.

* cited by examiner

*Primary Examiner*—David Nelms
*Assistant Examiner*—Thinh T Nguyen
(74) *Attorney, Agent, or Firm*—Oblon, Spivak, McClelland, Maier & Neustadt, P.C.

(57) ABSTRACT

An active matrix substrate comprises a substrate, a thick-film adhesive pad made of organic resin, provided on the substrate and including, at least at a part of a side face thereof, an inclined region having a first contact angle smaller than 90 degrees to the main face of the substrate, a thin-film active element provided on the thick-film adhesive pad, and a thin-film interconnection line connected to the thin-film active element and extending onto the substrate via the inclined region, a film thickness of the thick-film adhesive pad being four or more times that of the thin-film interconnection line.

13 Claims, 17 Drawing Sheets

ACTIVE MATRIX SUBSTRATE DISPLAY DEVICE

CROSS-REFERENCE TO RELATED APPLICATIONS

This application is a continuation of Ser. No. 10/392,840 Mar. 21, 2003 now U.S. Pat. No. 6,885,030.

This application is based upon and claims the benefit of priority from the prior Japanese Patent Application No. 2002-091546, filed Mar. 28, 2002, the entire contents of which are incorporated herein by reference.

BACKGROUND OF THE INVENTION

1. Field of the Invention

This invention relates to an active matrix substrate, a method of manufacturing the same, and a display device, such as a liquid-crystal display using an active matrix substrate or an EL (electroluminescence) display.

2. Description of the Related Art

Liquid-crystal display devices have the advantages of consuming less power and providing very detailed images and therefore are widely used in notebook personal computers, thin-model television sets, and the like.

Most of the liquid-crystal display devices presently used are formed on glass substrates and therefore tend to break easily. Thus, they need to be improved in this respect. At the same time, lighter display devices are required from the viewpoint of weight.

In addition, there have been strong demands for flexible liquid-crystal display devices capable of being curved freely like paper or being folded. To satisfy the demands, liquid-crystal display devices using light, flexible substrates superior in resistance to impact, such as made from plastic, have been proposed.

It is desirable that these display devices be capable of displaying sufficiently beautiful moving pictures. To do this, it is necessary to use an active matrix substrate where thin-film active elements, such as thin-film transistors, are integrated. That is, it is necessary to realize an active matrix substrate where a thin-film active element array is formed on a plastic substrate.

To form thin-film transistors using amorphous silicon or polysilicon currently widely used, high-temperature processes in the range of about 350° C. to 600° C. are essential and therefore it is difficult to form thin-film transistors on a plastic substrate capable of resisting temperatures up to about 200° C.

To solve this problem, the following technique has been proposed: in the technique, after thin-film transistors are formed on a highly heat-resistant substrate, such as a glass substrate, they are transferred onto a plastic substrate, thereby forming a thin-film transistor array on the plastic substrate.

With this method, thin-film transistors can be formed by conventional high-temperature processes, so that thin-film transistors with characteristics as good as those of conventional equivalents can be arranged on a plastic substrate. In this method, however, the cost for the transfer process is newly added as compared with the prior art, causing the problem of increasing the cost.

To solve this problem, the following method has been proposed: after a thin-film transistor substrate (or element formation substrate) on which thin-film transistors are formed very densely is formed on a highly heat-resistant substrate, such as glass, part of the thin-film transistors are transferred from the thin-film transistor substrate onto a plurality of plastic substrates (final substrates) sequentially, thereby forming a plurality of transistor arrays. In this case, the technique for selecting only the transistors to be transferred from a large number of thin-film transistors and transferring the selected ones is needed.

In the Jpn. Pat. Appln. KOKAI Publication No. 11-142878 (hereinafter, referred to as the prior art), a transfer destination substrate to which adhesive resin, such as acrylate-based UV cured resin or UV cured epoxy resin, is applied is laminated with a thin-film transistor substrate formed very densely beforehand on a UV peel resin, and ultraviolet rays are projected only onto the thin-film transistors selected with a photo mask, thereby selectively transferring the thin-film transistors.

In the prior art, the adhesive resin has adhesion only when only the ultraviolet-rays-exposed area is half-cured at a result of the projection of ultraviolet rays. That is, a transfer destination substrate that has adhesion when only the ultraviolet-rays-exposed area of the uniformly formed adhesive resin is half-cured has been proposed. The cured area on which ultraviolet rays are not projected is removed after the selective transfer.

Furthermore, another transfer destination substrate has been proposed which has concave sections in it and adhesive resin applied only to the concave sections, not uniformly, thereby localizing adhesion. Then, the thin-film transistors temporarily bonded onto a UV peel resin are transferred to a substrate having the localized adhesive layer. The UV peel resin has peeling quality when being exposed to ultraviolet rays.

However, the prior art has the following problems.

In the method of half-curing a part of the adhesive resin layer to be cured and thereby causing only the half-cured section to have adhesion, since the adhesive sections and the non-adhesive sections are located in the same plane at the time of transfer, not only the thin-film transistors to be transferred are bonded to the half-cured sections of the adhesive resin layer, but also the thin-film transistors not to be transferred are pressed against the cured sections of the adhesive resin layer. As a result, there is a possibility that the thin-film transistors will be bonded to not only the half-cured sections but also the cured sections and therefore many faults will take place in the transfer.

Furthermore, in the prior art, when the cured sections of the adhesive resin layer have been removed after the selective transfer, the interconnection lines of the thin-film transistors are formed. Since the steps formed at the ends of the adhesive resin layer are almost vertical, the interconnection line breakage rate can increase because of so-called step breakages.

Moreover, in the method of applying adhesive to the concave sections, the non-adhesive face around the adhesive face is flush with the adhesive face. When the thin-film transistors to be transferred come into contact with the adhesive resin, the thin-film transistors not to be transferred are pressed against the transfer destination substrate. In addition, this method causes another problem: adhesive resin leaks from the concave sections and adheres to the surrounding thin-film transistors. As a result, some of the unselected thin-film transistors might be transferred. This makes it difficult to reduce the cost.

Therefore, there has been a need to realize an active matrix substrate which is formed at low cost on a less heat-resistant substrate, such as a plastic substrate, by a selective transfer method and which is as good in performance as a conventional equivalent, a method of producing the active matrix substrate, and a display device.

BRIEF SUMMARY OF THE INVENTION

According to a first aspect of the present invention, there is provided an active matrix substrate comprising:

a substrate with a main face;

a thick-film adhesive pad made of organic resin, provided on the main face of the substrate and including, at least at a part of a side face thereof, an inclined region having a first contact angle smaller than 90 degrees to the main face of the substrate;

a thin-film active element provided on the thick-film adhesive pad; and a thin-film interconnection line connected to the thin-film active element and extending onto the substrate via the inclined region, a film thickness of the thick-film adhesive pad being four or more times that of the thin-film interconnection line.

According to a second aspect of the present invention, there is provided an active matrix substrate comprising:

a substrate;

a plurality of first thin-film interconnection lines provided substantially in parallel with a first direction on the substrate;

a plurality of thin-film active elements provided on the substrate, each of the plurality of thin-film active elements being connected to one of the plurality of first thin-film interconnection lines;

a plurality of first thick-film adhesive pads made of organic resin provided between each of the plurality of first thin-film interconnection lines and the substrate; and a plurality of second thick-film adhesive pads made of organic resin, provided between each of the plurality of thin-film active elements and the substrate and formed integrally with any one of the first thick-film adhesive pads.

According to a third aspect of the present invention, there is provided an active matrix substrate manufacturing method comprising:

forming a plurality of thin-film active elements on a first substrate;

transferring the plurality of thin-film active elements onto a second substrate;

forming a plurality of thick-film adhesive pads made of organic resin on a third substrate, so as to have, at least at a part of a side face thereof, an inclined region having a contact angle smaller than 90 degrees to a main face of the third substrate;

transferring part of the plurality of thin-film active elements on the second substrate onto the third substrate by causing the part of the plurality of thin-film active elements to adhere to the individual ones of the plurality of thick-film adhesive pads; and forming interconnection lines extending from the thin-film active elements on the third substrate onto the third substrate via the inclined regions.

According to a fourth aspect of the present invention, there is provided an active matrix substrate manufacturing method comprising:

forming a plurality of thin-film active elements on a first substrate;

transferring the plurality of thin-film active elements onto a second substrate;

forming a plurality of thick-film adhesive pads made of organic resin on a third substrate;

applying a stress to shift the second substrate and the third substrate relatively in opposite directions, with part of the plurality of thin-film active elements transferred onto the second substrate in contact with the individual ones of the plurality of thick-film adhesive pads, thereby not only causing the thin-film active elements to adhere to the thick-film adhesive pads for transfer but also forming an inclined region having a first contact angle smaller than 90 degrees to a main face of the third substrate at one side face of each of the plurality of thick-film adhesive pads; and forming interconnection lines extending from the plurality of thin-film active elements on the third substrate onto the third substrate via the inclined regions.

DETAILED DESCRIPTION OF THE INVENTION

Hereinafter, referring to the accompanying drawings, embodiments of the present invention will be explained.

FIRST EMBODIMENT

Figure 1:
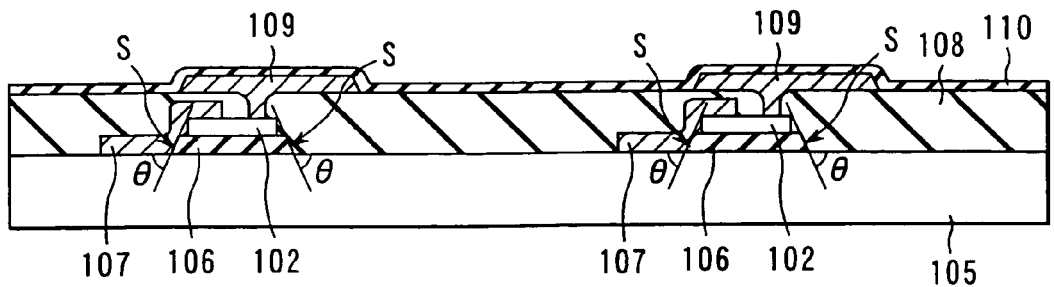
FIG. 1 is a sectional view of a part of an active matrix substrate according to a first embodiment of the present invention.

FIG. 1 is a schematic diagram showing a sectional configuration of a part of an active matrix substrate according to a first embodiment of the present invention. This active matrix substrate is used in a liquid-crystal display device.

The entire configuration of the active matrix substrate will be explained. On a substrate 105 made of plastic, resin, or the like, thick-film adhesion pads 106 made of adhesive resin are formed. Thin-film transistor elements 102 are bonded onto the pads 106. A interconnection line 107 is formed from each transistor element 102 to the substrate 105. The elements on the substrate are covered with a passivation film 108. A pixel electrode 109 is connected to each transistor element 102 via a contact opening. On the surfaces of the passivation film 108 and pixel electrodes 109, a liquid-crystal alignment film 110 is provided.

An opposite substrate (not shown) is provided on such an active matrix substrate and liquid crystal is sealed between the two substrates, which completes the display cells of a liquid-crystal display device.

In the manufacturing method, the thick-film adhesive pads 106 are provided only on the necessary regions of the substrate 105 and transistors 102 are transferred thereto. That is, because thick-film adhesive pads 105 are not formed in the unnecessary regions, the problem of transferring transistor elements 102 onto the unnecessary regions of the substrate 105 can be avoided. In this respect, the manufacturing processes will be explained in detail later.

Furthermore, in the embodiment, the side face S of a thick-film adhesive pad 106 does not rise straight up with respect to the main face of the substrate 105 and inclines at a contact angle of θ.

Making the contact angle θ smaller than 90 degrees prevents step breakages in the interconnection line 107 extending from the top of the element 102 to the substrate 105 by way of the side face S of the thick-film adhesive pad 106. That is, since the layer thickness of the thick-film adhesive pad 106 is about 1 to 10 μm and the layer thickness of the interconnection line 107 is about 0.2 to 0.5 μm, the line is much thinner than the thick-film adhesive pad 106 and therefore can hardly embed the step on the side face S. In such a case, when the contact angle θ of the side face S is close to perpendicular (or 90 degrees), the interconnection line 107 is liable to break at the side face S because of step breakage.

The present invention is effective in combining thick-film adhesive pads of 1 to 10 μm thick and the thin-film interconnection lines of 0.2 to 0.5 μm thick, that is, combining thick-film techniques and thin-film techniques. When the ratio of the thickness of a thick film to the thickness of a thin film is more than about 4:1 (for example, the thickness of a thick-film adhesive pad 106 is 2 μm or more and the thickness of a thin-film interconnection line 107 is 0.5 μm), the invention produces a useful effect.

Figure 2:
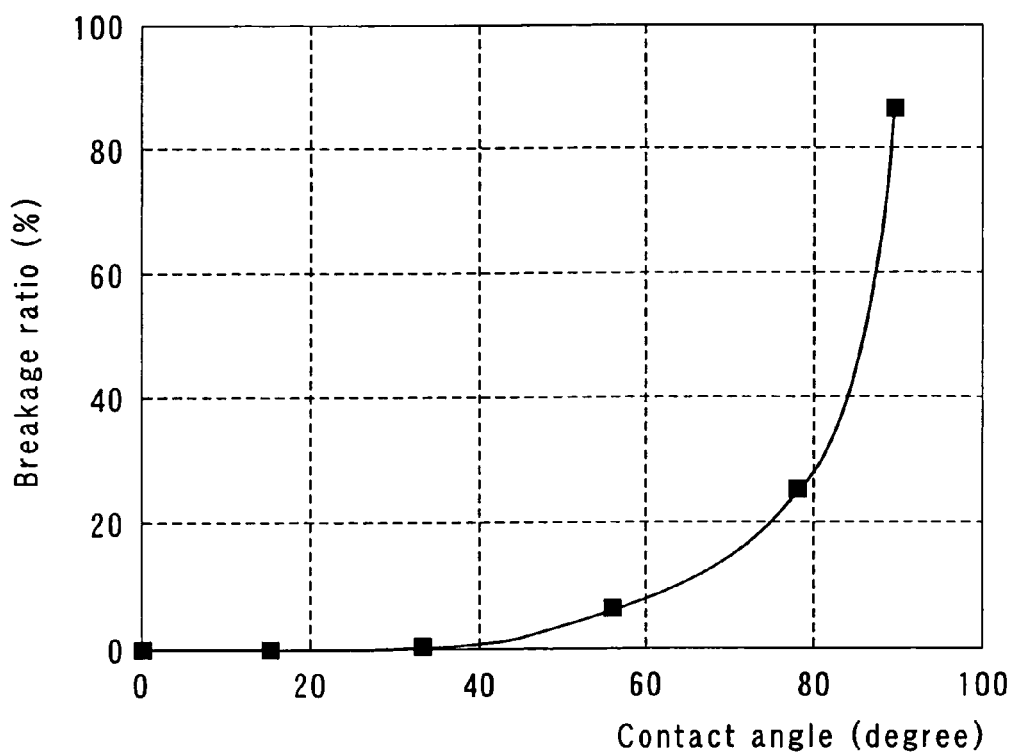
FIG. 2 is a graph showing an example of the relationship between the contact angle $\theta$ of the side face of a thick-film adhesive pad and the interconnection line breakage rate.

The inventors of this invention evaluated the interconnection line breakage rate due to step breakages in the interconnection lines 107, changing the contact angle θ variously. FIG. 2 is a graph showing an example of the relationship between the contact angle θ on the side face of a thick-film adhesive pad 106 and the line breakage rate of interconnection lines 107. When the contact angle θ was set at 90 degrees, that is, when the side face S was formed vertically, the line breakage rate was nearly 90%. When the contact angle θ was decreased to 80 degrees, the line breakage rate decreased to 30% or less. When the contact angle θ was decreased to 40 degrees, the line breakage rate decreased to 1% or less.

Making the contact angle θ too small causes the area of the base of the thick-film adhesive pad 106 to increase, occupying a larger area on the substrate 105. This can cause a decrease in the integration.

Therefore, it is desirable that the contact angle θ should be in the range of 40 degrees to 80 degrees. Setting the contact angle θ in this range prevents the breaking of the interconnection lines 107 effectively and at the same time, makes it easy to integrate thin-film transistor elements 102 very densely on a substrate.

Next, the basic concept of the method of manufacturing active matrix substrates in the first embodiment will be explained by reference to FIGS. 3A to 3E.

Figure 3A:
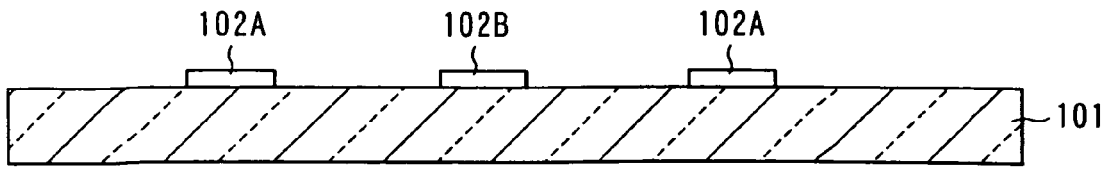
FIGS. 3A to 3E are sectional views showing, step by step, the concept of a method of manufacturing an active matrix substrate according to the first embodiment.

First, as shown in FIG. 3A, thin-film transistors 102 are formed on an element formation substrate 101. A highly heat-resistant glass substrate or quartz substrate may be used as the element formation substrate 101, which enables thin-film transistors with ordinary characteristics to be formed. Materials for thin-film transistors may be amorphous silicon or polysilicon.

Figure 3B:
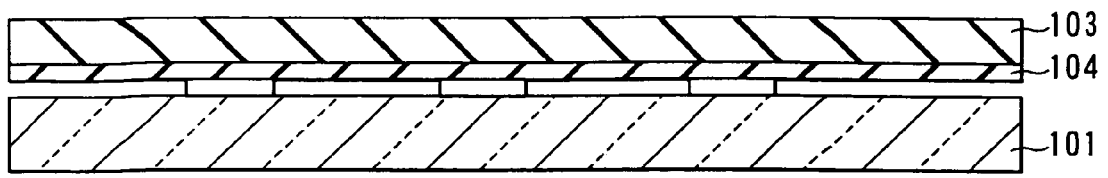

Next, as shown in FIG. 3B, thin-film transistors 102A, 102B are transferred to an intermediate transfer substrate 103 made of glass or silicon. That is, the intermediate transfer substrate 103 coated with a temporary adhesion layer 104 is prepared. The element formation substrate 101 is laminated with the intermediate transfer substrate 103. A material with the property of peeling by heat or by the projection of ultraviolet rays may be used as the temporary adhesion layer 104.

As the temporary adhesion layer 104, for example, a wax such as Apeazon wax (manufactured by Apeazon Product limited) may be used. Alternatively, a material which develops foams by heat application and loses its adhesiveness, for example, Revalpha (manufactured by Nitto Denko Corporation) may be used. Riba-alpha is so excellent in peeling-off property that the failure rate of the thin film transistors not transferred at the transfer process is effectively reduced. A material whose adhesiveness decreases by its phase transition upon heating, for example, Intelimer (manufactured by Nitta Corporation) may be used as well. Intelimer changes its adhesiveness reversibly so that it is suitable for the repetitive transferring of the thin film transistors when the thin film transistors are transferred onto a plurality of substrates, while holding the thin film transistors stably on the intermediate transfer substrate. A UV exfoliation tape may also be used. The UV exfoliation tape enables to ensure peeling-off of the thin film transistor to be transferred with use of a mask, so that stable and selective transferring of the thin film transistors can be realized. As the UV exfoliation tape, for example, UC series dicing tape presented by FURUKAWA Electric Co. LTD may be used.

Thereafter, the element formation substrate 101 is removed by etching or grinding. By doing this, all of the thin-film transistors 102A, 102B are transferred onto the intermediate transfer substrate 103.

Figure 3C:
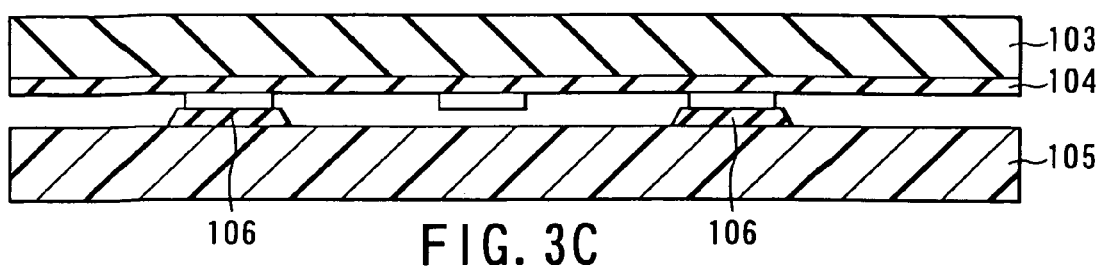

Next, as shown in FIG. 3C, a final substrate 105, a transfer destination substrate, is coupled with the intermediate transfer substrate 103. Specifically, thick-film adhesive pads 106 which are made of adhesive resin and have a specific pattern are formed on the final substrate 105. The thick-film adhesive pads 106 are formed by coating the adhesive resin on the front face of the substrate 105, forming a mask (not shown), and then patterning the adhesive resin layer by etching or the like. Alternatively, using photosensitive resin as a material for the adhesive resin 106 enables development by ultraviolet-ray mask exposure and the patterning of the resulting layer.

With the final substrate provided with the patterned thick-film adhesive pads 106 and coupled with the intermediate transfer substrate 103, heat is applied for a specific length of time. This causes the transistor elements 102A to be bonded to the thick-film adhesive pads 106 by thermocompression. In addition, when a material with the property of heat peeling is used as the temporary adhesion layer 104, this causes the adhesion of the temporary adhesion layer 104 to decrease, with the result that the temporary adhesion layer 104 has the property of peeling. When a UV exfoliation resin is used, UV light projection thereto after the thermocompression gives a peeling-off property to the UV exfoliation resin. On the other hand, the transistor elements 102B are not contact-bonded to the thick-film adhesive pads 106 and remain bonded to the temporary adhesion layer 104.

Figure 3D:
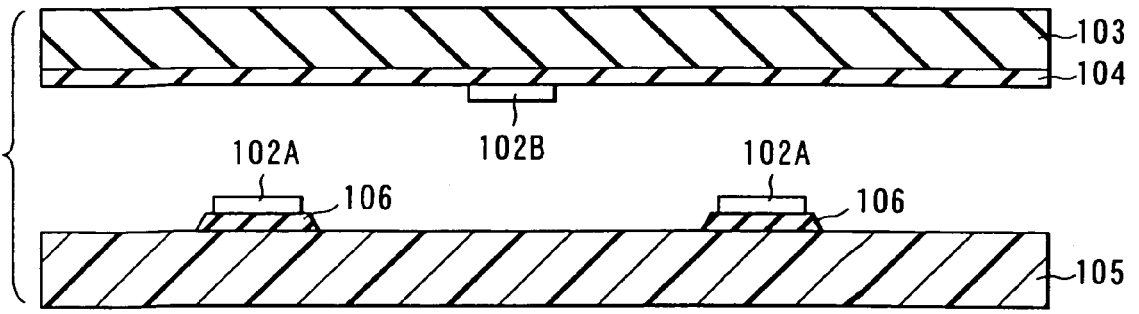

Next, as shown in FIG. 3D, the intermediate transfer substrate 103 is peeled off. Then, of the transistor elements 102A and 102B transferred onto the intermediate transfer substrate 103, only the transistor elements 102A bonded to the thick-film adhesive pads 106 are transferred to the final substrate 105. On the other hand, the transistor elements 102B remain stuck to the intermediate transfer substrate 103.

In this way, of a plurality of thin-film transistor elements 102A and 102B, only the transistor elements 102A bonded to the thick-film adhesive pads 106 formed in a specific pattern are transferred to the final substrate 105.

Figure 3E:
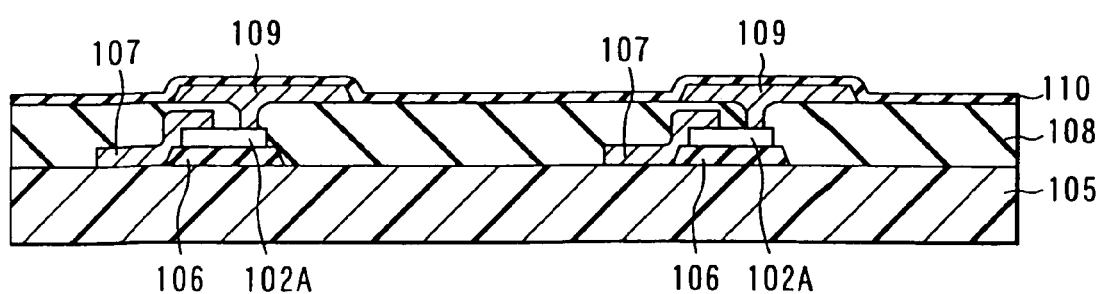
Figure 4:
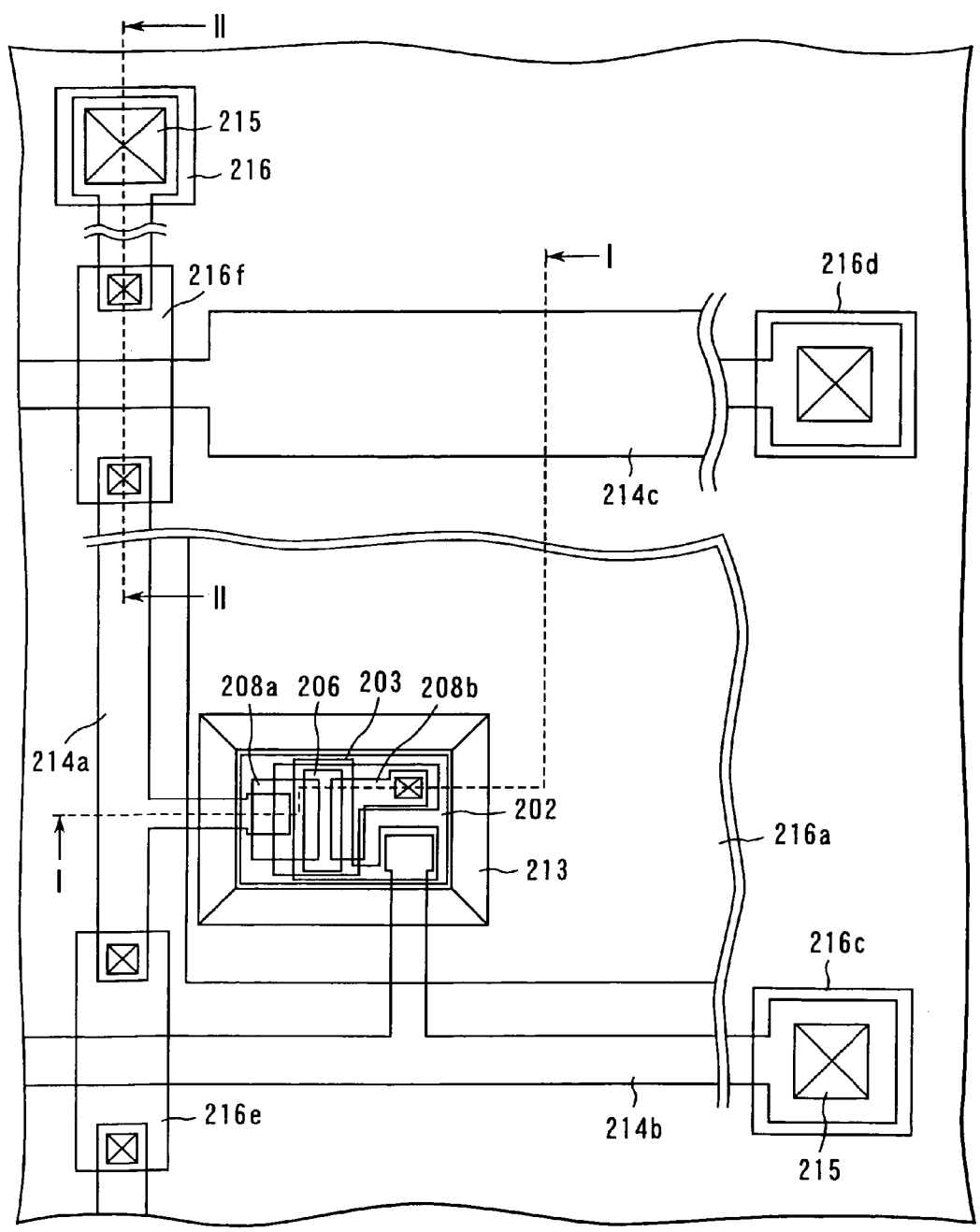
FIG. 4 is a schematic perspective plan view of the active matrix substrate of the first embodiment arranged with mask patterns thereof stacked one on top of another.

Thereafter, thin-film interconnection lines 107, a passivation film 108, pixel electrodes 109, a liquid-crystal alignment film 110, and others are formed, which completes the main part of the active matrix substrate as shown in FIG. 3E. At this time, giving a contact angle smaller than 90 degrees to the side face of the thick-film adhesion pad 106 prevents the thin-film interconnection line 107 from breaking.

While the active matrix substrate is being formed in this way, an opposite substrate on which transparent electrodes, a black matrix, and a color filter are provided is formed. The opposite substrate and the active matrix substrate are coupled with spacers between them in such a manner that a gap of several micrometers is left between the substrates. The periphery of the substrates is sealed and fixed with a sealing compound. Liquid crystal is injected into the gap and the inlet is sealed with ultraviolet curing resin or the like, which completes the display cell section of the liquid-crystal display device.

The integration density of transistor elements 102 on the element formation substrate 101 or intermediate transfer substrate 103 and the integration density of transistor elements on the final substrate 105 can be set suitably. For example, if the integration density of the element formation substrate 101 is four times as high as that of the final substrate, it is possible to transfer thin-film transistor elements from a single element formation substrate 101 to four final substrates 105 of the same size as the element formation substrate.

Therefore, as shown in FIGS. 3A to 3E, after the active matrix substrate using thin-film transistor elements 102A is formed, an active matrix substrate using thin-film transistor elements 102B can be manufactured with a new final substrate by the same processes, starting with the process of FIG. 3C.

As described above, with the first embodiment, use of a final substrate 105 with thick-film adhesive pads 106 in a specific pattern enables only the desired thin-film transistor elements 102 arranged on the intermediate transfer substrate 103 to be transferred reliably. That is, the problem of transferring unnecessary transistor elements can be overcome. As a result, it is possible to provide various types of display devices, including liquid-crystal display devices using plastic substrates, at low cost.

In addition, giving a contact angle smaller than 90 degrees to the side face of the thick-film adhesive pad 106 prevents step breakages in the thin-film interconnection lines 107, which eliminates faulty interconnection lines.

Furthermore, as will be described in detail later, making the thickness of the thick-film adhesive pad 106 several micrometers enables strain in the thin-film transistor element 102 to be alleviated. That is, with the present invention, use of a flexible substrate 105, such as a plastic substrate, enables an inexpensive, flexible display device. Moreover, even when a stress, such as a bend or a deflection, is applied to the substrate, the thick-film adhesive pads 106 of several micrometers in thickness absorb the stress to some extent, which suppresses faulty operations due to distortions or cracks in the thin-film transistor elements 102.

The first embodiment will now be explained in further detail, with reference to FIGS. 4 and 5A to 5E. FIGS. 5A to 5D are sectional views taken along line I—I of FIG. 4. FIG. 5E is a sectional view taken along line II—II of FIG. 4.

Figure 5A:
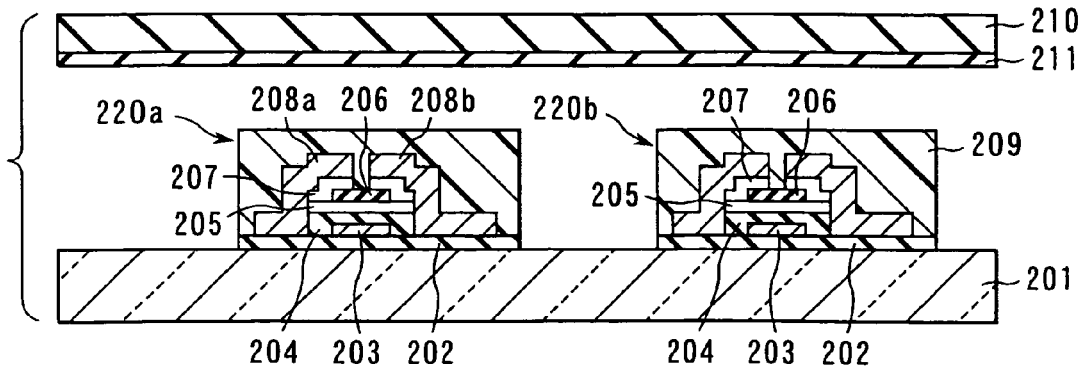
FIGS. 5A to 5E are sectional views showing, step by step, a method of manufacturing an active matrix substrate according to the first embodiment.

First, as shown in FIG. 5A, thin-film transistors are formed on an element formation substrate 201 and an intermediate transfer substrate 210 is prepared. Specifically, for example, an undercoat layer 202 is formed to a thickness of about 200 nm to 1 μm on the highly heat-resistant glass substrate 201. It is desirable that a silicon oxide (SiOx) film or a silicon nitride (SiNx) film should be used as the undercoat film 202, because use of such a film prevents ionic impurities from entering into the thin-film transistors. Stacking the silicon oxide film and the silicon oxide film one on top of the other enhances the effect further.

Next, a metal layer made of molybdenum tantalum (MoTa), molybdenum tungsten (MoW), or the like is deposited to a thickness of about 300 nm by sputtering techniques or the like and the resulting layer is patterned to form gate electrodes 203. Next, gate insulating film layer 204 made of silicon oxide, silicon nitride, or the like, channel layers 205 made of a semiconductor, such as amorphous silicon, and an insulating film layer made of silicon nitride or the like are deposited in this order by plasma CVD (Chemical Vapor Deposition) techniques. The insulating film is patterned to form a channel protective layer 206.

It is assumed that the gate insulating film 204 has a thickness of about 100 nm to 400 nm, the channel layer 205 has a thickness of about 50 nm to 300 nm, and the channel protective layer 206 has a thickness of about 50 nm to 200 nm. The gate insulating film 204 may be made of a high dielectric film or a ferroelectric substance film, such as a tantalum oxide (TaOx) film or a PZT (lead zirconote titanate) film. In this case, since the permittivity of the material is large, the film can be made thinner, which helps cut formation costs. In addition, use of a ferroelectric substance film enables memory-based driving, which reduces the power consumption in driving.

Thereafter, a phosphorus-doped n-type semiconductor layer is formed to a thickness of about 30 nm to 100 nm by plasma CVD. Then, the semiconductor layer is etched to the channel layers 205 and the gate insulating film layers 204 to form island patterns of thin-film transistors.

Then, a metal layer made of a single layer of molybdenum (Mo) or aluminium (Al), or a stacked layer of them is deposited to a thickness of 200 nm to 400 nm by sputtering. Thereafter, the metal layer and the n-type semiconductor layer are etched by wet etching or dry etching to form source electrodes 208a and drain electrodes 208b. At this time, the channel layers 205 will not be damaged by etching, because the channel protective layers 206 function as etching stoppers.

Thereafter, a photoresist is applied and mask exposure is performed using ultraviolet rays, thereby forming protective layers 209, made up of a photoresist pattern, to a thickness of about 2 to 10 μm. With the photoresist pattern as a mask, the undercoat layer 202 is etched, thereby separating thin-film transistors 220a and 220b.

In the processes explained above, thin-film transistors are formed on a highly heat-resistant glass substrate as in widely used conventional liquid-crystal display devices. Consequently, thin-film transistors can be formed in high-temperature processes as in the prior art. Therefore, thin-film transistors have electrical characteristics at least as good as those of conventional thin-film transistors. Because the embodiment is directed to form many liquid-crystal display devices from a denser thin-film transistor array substrate (or intermediate transfer substrate), the formation pitch of thin-film transistors is devised as small as possible.

Next, an intermediate transfer substrate 210 to which the thin-film transistor array is to be transferred temporarily is prepared. On the intermediate transfer substrate 210, a temporary adhesion layer 211 is formed. The temporary adhesion layer 211 has a property of reduced adhesion when heated.

Figure 5B:
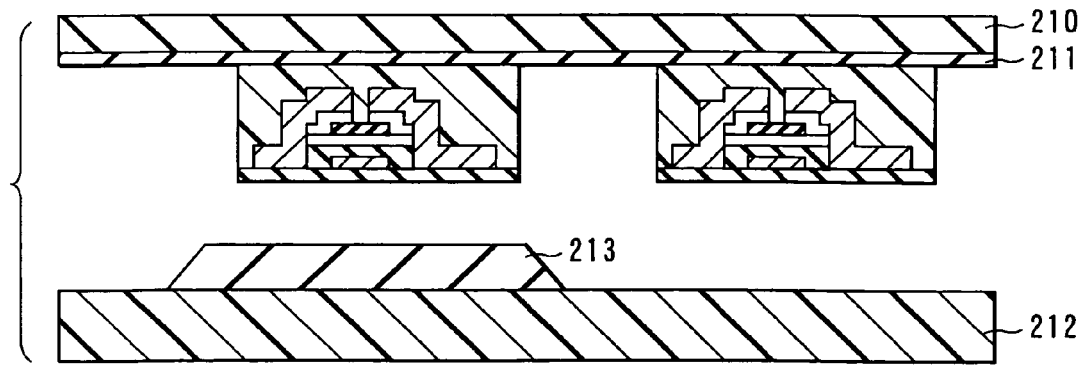
Figure 5C:
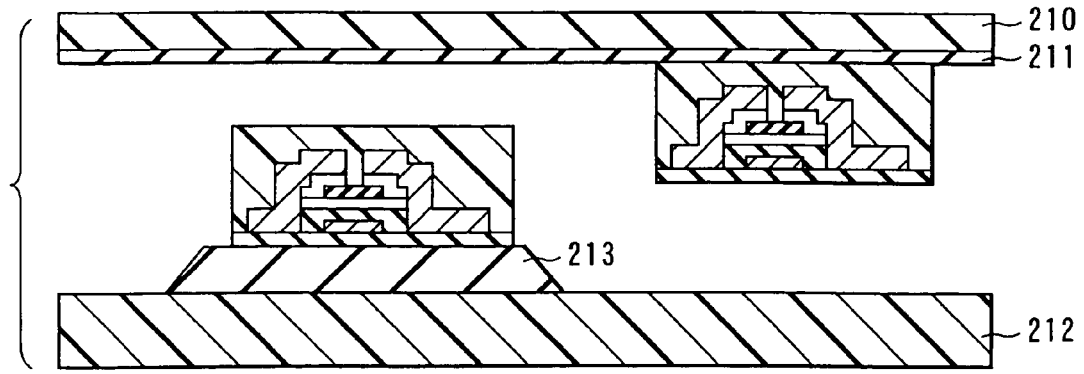

Next, as shown in FIG. 5B, the thin-film transistor array is transferred to the intermediate transfer substrate 210 and on the other hand a final substrate 212 is prepared.

Specifically, the intermediate transfer substrate 210 is pressed against the thin-film transistor array formed on the element formation substrate 201. Then, the thin-film transistor array is coupled to the intermediate transfer substrate 210 by the adhesion of the temporary adhesion layer 211. Next, the element formation substrate 201 is removed. To remove the element formation substrate 201, wet etching using a chemical such as fluoric acid, or chemical mechanical polishing for mechanically grinding the element formation substrate, with the substrate immersed in a chemical, may be used.

Instead of removing the glass substrate 201, a hydrogenated amorphous silicon layer (not shown) may be inserted between the undercoat layer 202 and the glass substrate 201 and then be ablated as a result of the projection of laser light, thereby separating the glass substrate 201 from the thin-film transistors.

By such processes, the thin-film transistors 220a and 220b are bonded temporarily to the intermediate transfer substrate 210 in such a manner that they are independent of each other.

On the other hand, a final substrate 212 to which the thin-film transistors bonded temporarily to the intermediate transfer substrate 210 are transferred is prepared. A plastic substrate or a flexible substrate, such as polyether-etherketone (PEEK), polyethylene naphthalate) (PEN), polyether sulfone (PES), or polyimide (PI), may also be used as the final substrate 212.

Using a flexible substrate makes it possible to realize a display device capable of being curved like paper or being folded. Of course, a nonflexible substrate, such as a glass substrate or a silicon substrate, may also be used.

On the final substrate 212, thick-film adhesive pads 213 are formed to a thickness of about 1 μm to 5 μm only in the transfer areas to which transistor elements are to be selectively transferred. At this time, the thick-film adhesion pad 213 is so formed that the taper angle of the side face of the pad 213 is about 40 degrees to 80 degrees. Giving such a taper angle reduces the breakage rate of the thin-film interconnection lines formed later.

The thick film adhesive pad 213 is made of an adhesive organic resin such as acrylic resin. As acrylic resin, for example, Optomer, a positive photosensitive acrylic resin manufactured by JSR corporation, can be used. There is no problem in using polyimide resin or other organic resin instead of acrylic resin. Note that formation of the thick film adhesive pad 213 using the same organic material as the protective layer 209 increases adhesiveness of the adhesive pad 213 at transferring.

Here, a method of forming a thick-film adhesive pad 213 with a desired taper angle at its side face will be explained.

FIGS. 7A to 7D are sectional views showing, step by step, a method of forming a thick-film adhesive pad 213. In the figures, an embodiment where acrylic resin with a positive photosensitivity is used as a material for a thick-film adhesive pad 213 will be explained.

Figure 7A:
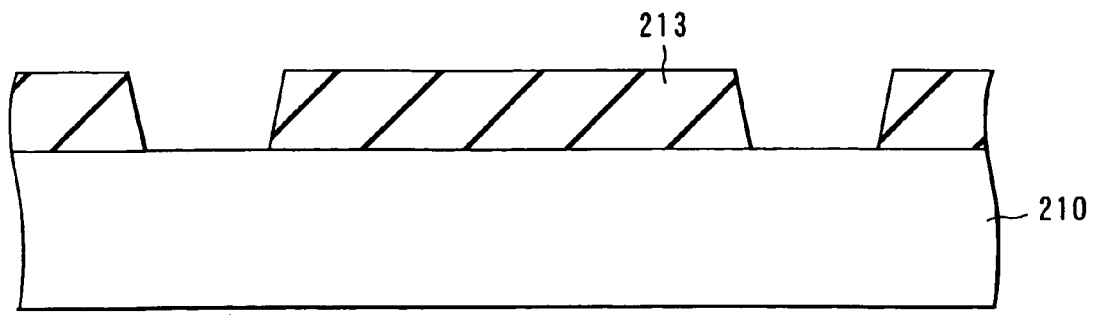
FIGS. 7A to 7D are sectional views showing a stop by step, a method of forming a thick-film adhesive pad.

First, as shown in FIG. 7A, acrylic resin is formed into a specific pattern on the substrate 201. Specifically, acrylic resin 213 is coated on the final substrate 212 to a thickness of 2 μm to 10 μm by spin coating or the like. Thereafter, the acrylic resin is baked at a low temperature of abort 60° C. to 100° C., with a hot plate. Then, with a photo mask (not shown), the acrylic resin is exposed to ultraviolet rays for development, thereby forming the acrylic resin into a pad with an island pattern. After this process, the contact angle of the side face of the acrylic resin pad is about 80 to 85 degrees.

Figure 7B:
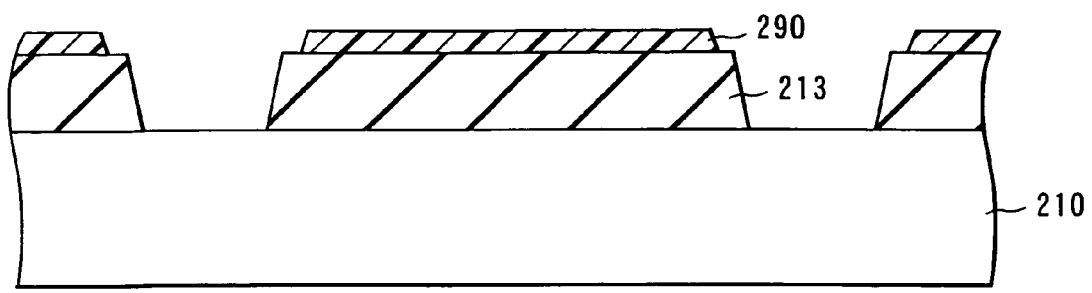

Next, as shown in FIG. 7B, a photoresist mask 290 is formed. Specifically, on the acrylic resin pad 213, a novolac-based positive photoresist is coated to a thickness of about 0.2 to 1.0 μm. Then, the photoresist is baked at about 80°. Thereafter, using a photo mask, the photoresist is exposed to ultraviolet rays for development, thereby forming a photoresist mask 290. At this time, an island pattern smaller than the top of the acrylic resin island pattern is formed in such a manner that the smaller pattern lies on the pattern of the already formed acrylic resin pad 213.

Figure 7C:
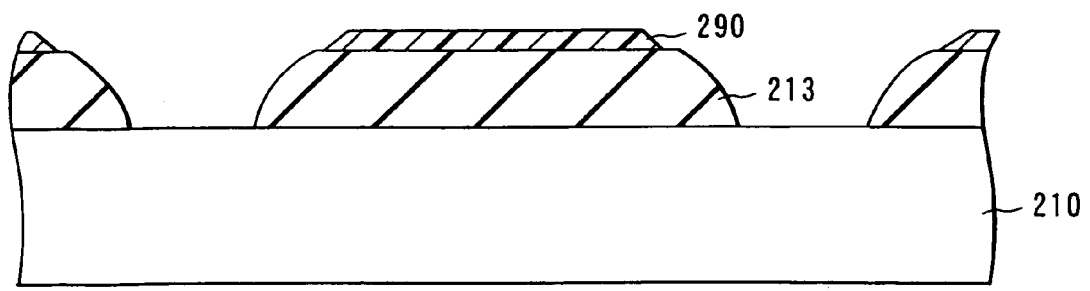

Next, as shown in FIG. 7C, the surface is etched slightly. Specifically, etching is done in an atmosphere of a $CF_4$-gas-and-$O_2$-gas mixture by chemical dry etching (CDE). At this time, since the etching speed of the photoresist mask 290 is greater than the etching speed of the acrylic resin pad 213 and the film thickness of the photoresist 209 is less than the acrylic resin pad 213, the photoresist mask 290 disappears around the pad as the etching progresses, with the result that a taper is formed at the side face of the acrylic resin pad 213. Experiments conducted by the inventors of this invention have shown that a contact angle of about 40 to 70 degrees to the substrate can be realized by this method.

Figure 7D:
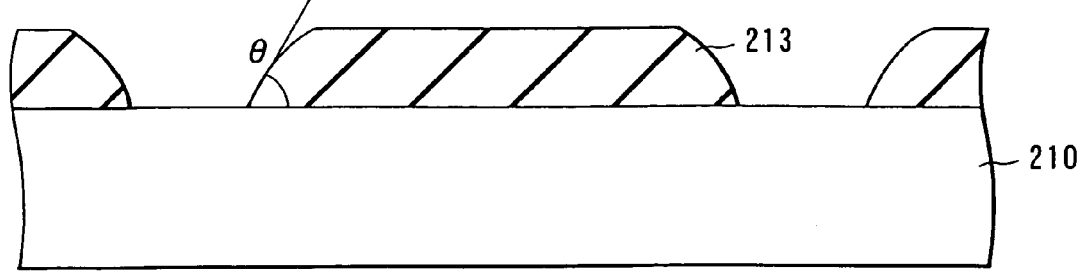

Finally, as shown in FIG. 7D, the photoresist mask 290 is removed using a resist stripping agent or the like, which produces a thick-film adhesive pad 213 with a desired contact angle.

Instead of removing the photoresist mask 290, the mask 290 may be used as an adhesion layer.

After the photoresist mask 290 is removed, an island pattern of a photoresist is formed again. Using the mask, etching is done by CDE, thereby removing the photoresist. Adding this process enables the contact angle of the side face of the thick-film adhesive pad to be made still smaller. By repeating this process any number of times, the contact angle can be made much smaller.

Furthermore, an organic resin material with a negative photosensitivity may be used as the thick-film adhesive pad 213. In the case of a pattern obtained by exposing and developing a negative material, the contact angle generally tends to be large and becomes 90 degrees or more, depending on the situation. For this reason, it is desirable that an organic resin material with a positive sensitivity be used. As in this embodiment, however, forming a photoresist 290 for an additional etching process enables the contact angle to be made smaller even in an organic resin with a negative photosensitivity.

As a material for the thick-film adhesive pads 213, polyimide resin may be used in addition to the acrylic resin. Use of these resins is excellent in that the resins will not deteriorate even at high temperatures ranging from 200° C. to 300° C. in an interconnection line forming process, a passivation film forming process, and the like, explained later. In a case where a transparent liquid-crystal display device is formed, acrylic resin is excellent in optical efficiency, since its visible light transmittance is sufficiently high.

What is obtained by distributing minute particles of metal, such as chromium, into the thick-film adhesive pads 213 or a black resist may be used. By darkening or opaquing the resist by these methods, light leaks into the thin-film transistors transferred to the thick-film adhesive pads 213 are reduced, which improves the transistor switching ratio and therefore improves the picture quality of the liquid-crystal display device finally formed.

Use of a photosensitive organic resin for the thick-film adhesive pads 213 makes patterning easy, which reduces the manufacturing costs as compared with use of a resin with no photosensitivity. Of course, a resin with no photosensitivity can be patterned by etching, printing, or the like.

Returning to FIG. 5, explanation will be continued. Following the step of FIG. 5B, a specific thin-film transistor element 220a is transferred to the final substrate 212. Specifically, the intermediate transfer substrate 210 is coupled with the final substrate 212 in such a manner that the thin-film transistor 220a to be transferred is aligned with the thick-film adhesive pad 213 so as to be set on the latter. In the coupling method, a contact bonding machine where two parallel or almost parallel flat plates are pressed against each other may be used or a contact bonding machine that has a roller on a flat plate may be used. Alternatively, the substrates may be coupled together with a contact bonding machine having two rollers.

Next, with the intermediate transfer substrate 210 and the final substrate 212 coupled together, the entire panel is heated or exposed to ultraviolet rays. The adhesion of the temporary adhesion layer 211 of the intermediate transfer substrate 210 is thus reduced as a result of heating or exposure to ultraviolet rays. At the same time, the organic resin constituting the thick-film adhesive pads 213 becomes soft and viscous. The thin film transistors 220a in contact with the thick-film adhesive pads 213 are bonded thereto due to the adhesiveness of the thick-film adhesive pad, while the thin film transistors 220b out of contact with the thick-film adhesive pads 213 are still fixed to the temporary adhesion layer 211 without transferring to the final substrate 212. This is due to the fact that the temporary adhesion layer 212 keeps its adhesiveness to fix the thin film transistors 220a, though the adhesiveness of the temporary adhesion layer 211 is reduced due to heating or exposure to ultraviolet rays, but does not come to zero. Transferring of the thin film transistors 220a to the thick-film adhesion pads 213 is carried out on the fact that the adhesiveness of the thick-film adhesive pads 213 is higher than that of the temporary adhesion layer 211. This makes it possible to selectively transfer the thin-film transistors 220a only onto the thick-film adhesive pads 213.

Here, setting the thick-film adhesive pads 213 to a thickness of 1 µm to 10 µm prevents the thin-film transistors 220b not to be transferred from being transferred in a subsequent transfer process. Furthermore, use of the thick-film adhesive pads 213 with a dynamic hardness of 30 or more prevents unwanted transfer of the thin-film transistors. The reason why increasing the film thickness or hardness of the thick-film adhesive pads 213 reduces such faults in the transfer of the thin-film transistors is that the step produced by the thickness of the thick-film adhesive pads 213 maintains a sufficient height during the transfer.

The thick-film adhesive pad 213 has a slope tapered under 90 degree at the side face thereof, which further reduces a deformation by a pressure applied when transferring. Providing a tapered angle on the side face reduces a deformation by a pressure applied to the thick-film adhesive pad 213 in a direction perpendicular to the substrate in a smashing manner. Furthermore, it reduces a deformation of the thick-film adhesive pad in a horizontal direction by a horizontal pressure applied thereto.

Especially, a large degree of deformation regarding to the thick film adhesive pad in a horizontal direction brings a tapered angle over 90 degree on the side face thereof, with the result that an interconnection breakage occurs when the interconnection is formed thereon, or a void is formed when a film is provided thereon. Therefore, such a deformation should be suppressed as little as possible.

Furthermore, it has been seen that the adhesive strength of the thick-film adhesive pad itself increases as the tapered angle becomes smaller. It is assumed that this is because the surface viscosity of the thick-film adhesive pad changes due to the shape of the thick-film adhesive pad, or due to a forming process of the tapered angle. Thus, the forming of the thick-film adhesive pad having a tapered angle under 90 degree on the side face thereof further reduces the defects that the unwanted thin film transistors are transferred when transferring, and secures the transferring of the wanted thin film transistors.

Furthermore, when the thin-film transistors 220a are pressed against the final substrate 212 and transferred to the substrate 212, the thick-film adhesive pads 213 have a film thickness of 1 µm to 10 µm. The film thickness absorbs the pressure during the transfer, alleviating damage to the thin-film transistors 220a, which enables the thin-film transistors 220a to maintain good electrical characteristics even after the transfer. Particularly in the first embodiment, since a highly viscous acrylic resin is used for the thick-film adhesive pads 213, the thick-film adhesive pads 213 absorb the pressure more effectively.

Furthermore, when the thick-film adhesive pads 213 are completely hardened by annealing the final substrate 212 to which the thin-film transistors 220a have been transferred, at temperatures ranging from about 200° C. to 250° C., for about 30 minutes to one hour in an atmosphere of nitrogen by means of an oven, the degree of adhesion to the thin-film transistors 220a increases. In addition, the characteristics of the thin-film transistors 220a are improved.

By repeating the selective transfer process a plurality of times, a plurality of thin-film transistor array substrates can be formed from a single intermediate transfer substrate 210 on which thin-film transistors have been formed very densely. This reduces the cost for manufacturing thin-film transistor arrays.

Furthermore, a plurality of transfers from the intermediate transfer substrate 210 make it possible to form a thin-film transistor array on a final substrate 212 larger in size than the intermediate transfer substrate 210. That is, a thin-film transistor array for a large-sized liquid-crystal display device can be formed from a small substrate, which helps make a thin-film transistor manufacturing apparatus more compact.

While in the embodiment, only thin-film transistors have been transferred, thin-film elements of any other type may be transferred. For instance, storage capacitors to be formed in parallel with the pixel electrodes of the liquid-crystal display device may be transferred. This makes it possible to form capacitance elements on a plastic substrate at low cost. In the capacitance elements, a silicon oxide (SiOx) film or a silicon nitride (SiNx) film formed at a high temperature equal to or higher than 300° C. by CVD is used as an insulating layer.

The capability of transferring storage capacitors particularly enables capacitance elements composed of a ferroelectric substance film or a high dielectric film difficult to form even on a conventional highly heat-resistant glass substrate, such as a PZT (lead titanate zirconate) film or a BaTiO3 (barium titanate) film, be formed on a plastic substrate.

Of course, it is possible to transfer a sophisticated circuit, such as a pixel memory circuit formed by combining thin-film transistors and capacitance elements. The element formation substrate is not limited to a glass substrate and may be a monocrystalline silicon substrate. Therefore, even monocrystalline silicon transistors difficult to apply to a large-sized liquid-crystal display device because a large silicon single crystal could not be formed in the prior art can be distributed and transferred onto a plastic substrate larger than the element formation silicon substrate, using the transfer method of this invention. That is, sophisticated circuit elements, such as single crystal silicon transistors, can be transferred to a plastic substrate and formed there. This makes it possible to form, at low cost, a display device which is made up of a plastic substrate and has a memory function, or other sophisticated functions, for each pixel or on the peripheral region of the display.

After the thin-film transistors 220a are selectively transferred onto the thick-film adhesive pads 213, the protective layers 209 are removed by a resist stripping agent or the like. Forming the protective layer 209 from photoresist alleviates pressure on the thin-film transistors 220a during transfer and further prevents the etching solution from soaking into the thin-film transistors 220a and 220b in removing the element formation substrate 201. Furthermore, the photoresist 209 can be removed easily by an organic solvent, such as acetone. This makes it possible to transfer the thin-film transistors 220a and 220b without degrading their performance.

In addition to a photoresist, various organic materials may be used as the protective layers 209. For instance, photosensitive resin, such as the THB resist series produced by JSR corporation, may be used. If a THB resist is used, a thickness of several tens of micrometers can be realized easily and its hardness is low. Therefore, pressure on the thin-film transistors during transfer can be absorbed, which further reduces deterioration in performance of the thin-film transistors. It is possible to use a photosensitive polyimide resin. The polyimide resin has a high viscosity and effectively absorbs the pressure at the transferring. Furthermore, the polyimide resin effectively prevents cracks of the elements from occurring due to the stress change at removing the element formation substrate 201.

Furthermore, various inorganic materials may be used as the protective layers 209. For instance, use of a silicon nitride (SiNx) film or a silicon oxide (SiOx) film as the protective layers 209 effectively prevents the entrance of ionic impurities, such as sodium ion, that degrade the electrical characteristics of thin-film transistors.

In addition, a two or multi-layer structure of an organic material and an inorganic material may be used as the protective layers 209. Use of a structure where an organic material and an inorganic material are stacked one on top of the other to form a layer makes it possible to form protective layers 209 that have the merits of both materials. The protective layers 209 may be or not be removed after the transfer.

In a structure where the protective layers 209 are not removed, through holes are made in the protective layers 209 to provide electric connection with the gate electrodes 203, source electrodes 208a, and drain electrodes 208b of the thin-film transistors. The through holes may be made before or after the transfer. It is desirable that the through holes be formed after the transfer, because this approach can prevent the entrance of etching solution during transfer.

Figure 5D:
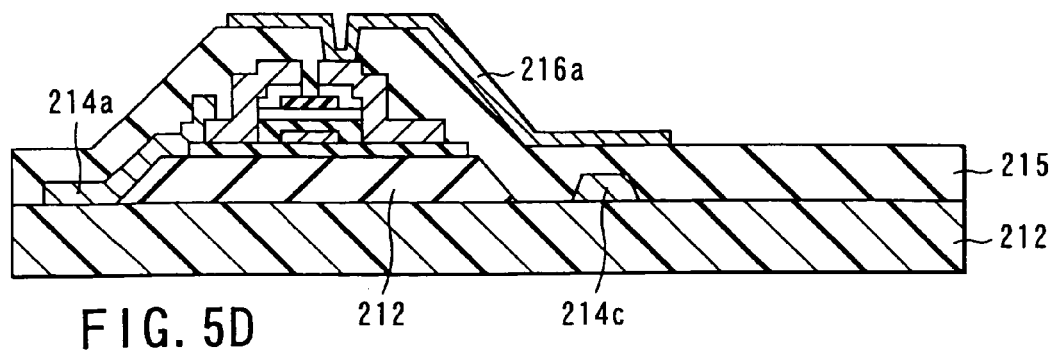
Figure 5E:
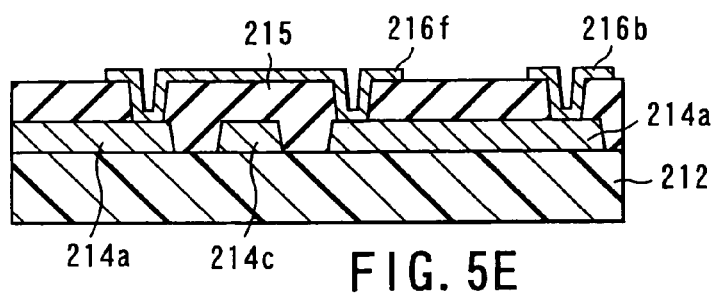

Next, as shown in FIGS. 5D and 5E, interconnection lines are formed. Specifically, on the final substrate 212, a metal such as molybdenum (Mo) or aluminum (Al) is deposited to a thickness of 200 nm to 400 nm and the resulting layer is patterned so as to form gate lines 214b, storage capacitor lines 214c, and signal lines 214a. As seen from FIG. 4, the signal line 214a is cut off at a cross section with the gate line 214b and at the cross section with the storage capacitor line 214c. The gate line 214b and signal line 214a are connected to the gate electrode 203 and source electrode 208a of a thin-film transistor, respectively.

In the first embodiment, since a taper is given to the side face of the thick-film adhesive pad 213, the problem of the thin-film signal line 214 breaking at the step portion is solved.

Thereafter, an organic film is applied to a thickness of about 1 to 4 μm and the resulting film is patterned to form a passivation layer 215.

Thereafter, a metal such as aluminum is deposited and the resulting layer is patterned so as to form reflecting pixel electrodes 216a, signal-line pad electrodes 216b, gate-line pad electrodes 216c, and storage capacitor pad electrodes 216d. A pixel electrode is connected to the drain electrode of a thin-film transistor via a through hole. An Al pattern is formed at the cross portion of the signal line 216a and the gate electrode 214b and an Al pattern 216f is formed at the cross portion of the signal line and the storage capacitor line, which provides bridge connection with the signal line 216a.

That is, the formation of the top electrodes acting as both reflecting pixel electrodes and storage capacitors and the connection of interconnection lines are carried out in the same processes, which decreases the number of formation processes. This improves the yield in forming thin-film transistor arrays and reduces the costs.

The pixel electrodes 216a, signal-line pad electrodes 216b, gate-line pad electrodes 216c, storage capacitor line pad electrodes 216d, signal-line gate-line cross portions 216e, signal-line storage-capacitor-line cross portions 216f may be made of any metal excluding Al. Alternatively, they may be made of a transparent dielectric film, such as ITO (Indium Tin Oxide).

Furthermore, in the first embodiment, at the cross portion of the signal line 214a and the gate line 214b, only the gate line 214b side is connected in advance and the signal line 214a is connected to a metal (216f) formed into a pixel electrode 216a at a subsequent process. In contrast, the signal line 214a side may be connected in advance and the gate line 214b may be cut off at the cross portion. In a subsequent process, the gate lines 214b may be connected together with the same material as that for the pixel electrode 216a.

While in the first embodiment, the passivation film 215 has a single-layer structure and also serves as an insulating film for storage capacitors, it may have another structure.

Figure 6A:
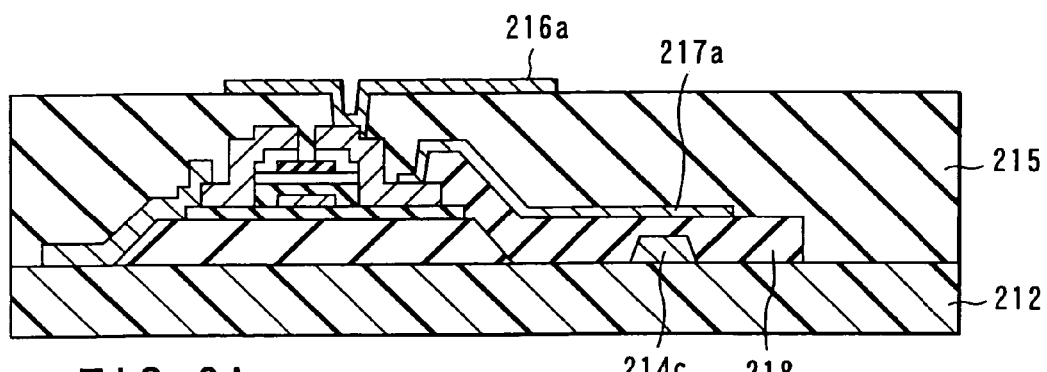
FIGS. 6A and 6B are sectional views showing a modification of FIGS. 5D and 5F.
Figure 6B:
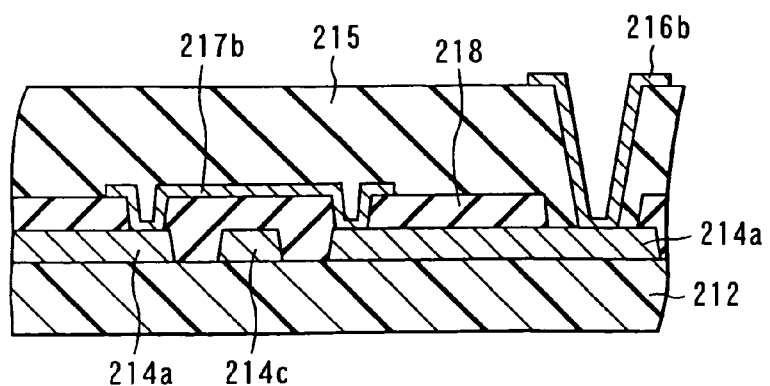

For instance, as shown in FIGS. 6A and 6B, the passivation layer may be designed to have a two-layer structure. That is, in the embodiment, a first-layer passivation film 218 is made relatively thin to a thickness of about 200 nm to 500 nm and a second-layer passivation film 215 is made relatively thick to a thickness of about 2 µm to 10 µm so that the top surface on which the pixel electrodes are formed may be almost flat. Then, a metal layer 217a is newly formed on the first-layer passivation film 218.

The metal layer 217a becomes the top electrode of the storage capacitor. The metal deposited simultaneously with the top electrode metal 217a of the storage capacitor is used as the junction metal 217b of the cross portion of the signal line and the gate line and the junction metal 217c of the cross portion of the signal line and the storage capacitor line. With this configuration, the thin first passivation film 218 makes it possible to form a larger storage capacitor with a smaller area and the thick second passivation layer enables the pixel electrode to be flattened.

Since the step in the first passivation film 218 in each of the interconnection line junctions 217b and 217c is small at the cross portion, the line is less liable to break.

On an active matrix substrate formed as shown in FIGS. 5D and 5E or FIGS. 6A and 6B, a polyimide film (not shown) is deposited and the resulting film is subjected to alignment treatment. In this way, an active matrix substrate for liquid-crystal devices is formed.

On the other hand, a transparent opposite substrate including a common electrode layer made of transparent conducting film, such as ITO, a black matrix layer, and a color filter layer is prepared. The opposite substrate is coupled to the final substrate with spacers, leaving a gap of several micrometers between them. The periphery of the two substrates is fixed with sealant and liquid crystal is injected between the two substrates. While in the embodiment, twisted nematic liquid crystal has been used as the liquid crystal, any other liquid crystal, such as guest-host liquid crystal, cholesteric liquid crystal, or ferroelectric liquid crystal, may be used. In this way, a liquid-crystal display cell having a thin-film transistor is formed. Then, the gate line 214b, signal line 214a, and common electrode are connected to a driving circuit, which completes a liquid-crystal display device.

In the first embodiment explained above, since the contact angle of the side face of the adhesion layer 213 is less than 90 degrees, breakage in the interconnection lines decreases in number, which provides a good image in which dot or line display defects can hardly be found. When the liquid-crystal display device is driven for many hours in the prior art, current flowing through the interconnection lines on the side faces of the adhesion layers 213 for a long time can lead to breakage in some lines and therefore increase display defects. In this modification, however, such defects are remarkably decreased in number.

On the other hand, since the thick-film adhesive pad 213 is sufficiently thick in the range of 1 µm to 10 µm, even if mechanical stress is applied to a liquid-crystal display device using a plastic substrate or a flexible substrate, the stress is alleviated, decreasing cracks in the thin-film transistors or changes in the electrical characteristics, including mobility, which prevents a decrease in the picture quality.

SECOND EMBODIMENT

Figure 8:
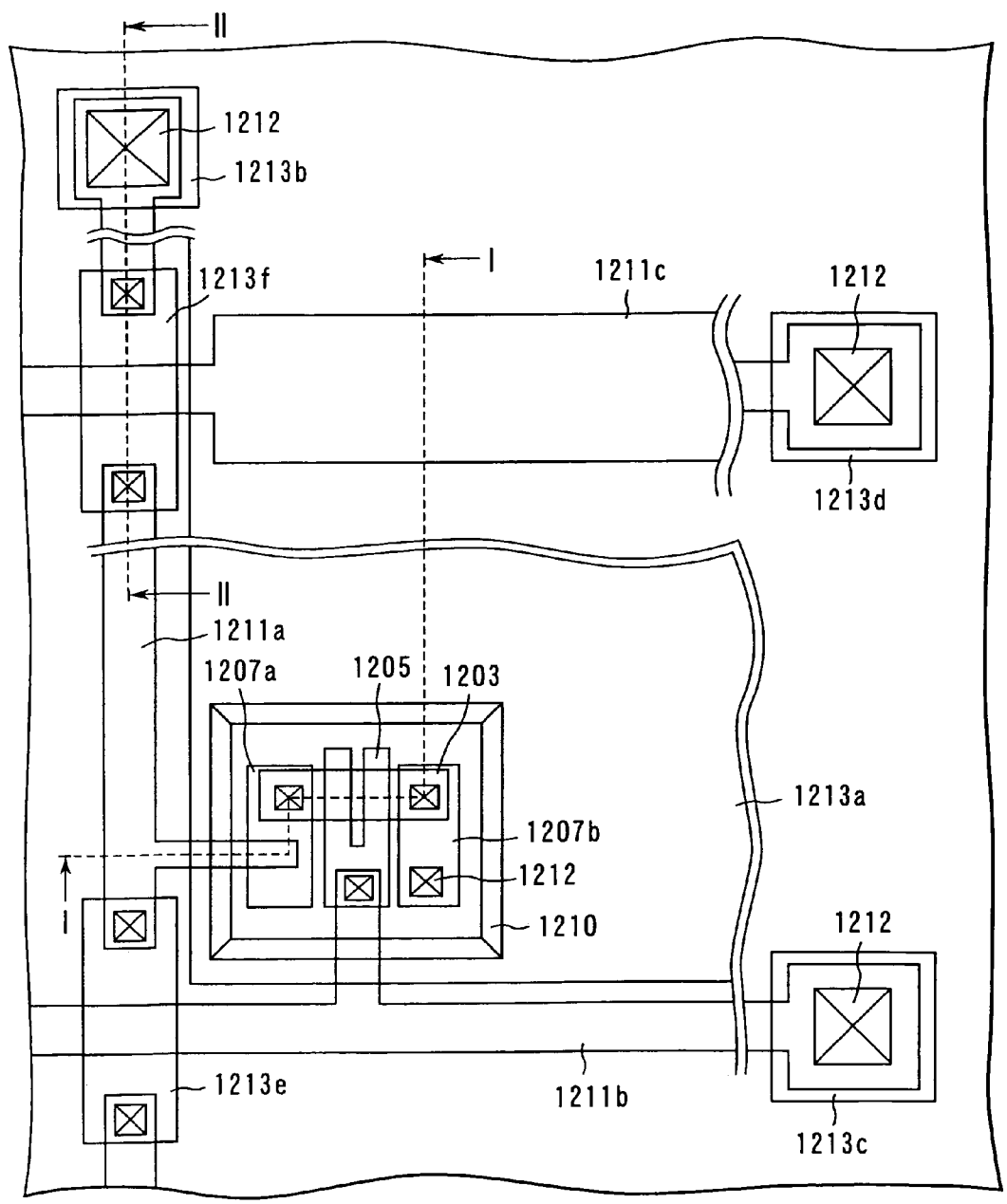
FIG. 8 is a schematic diagram showing a perspective plan configuration of an active matrix substrate according to a second embodiment of the present invention.
Figure 9A:
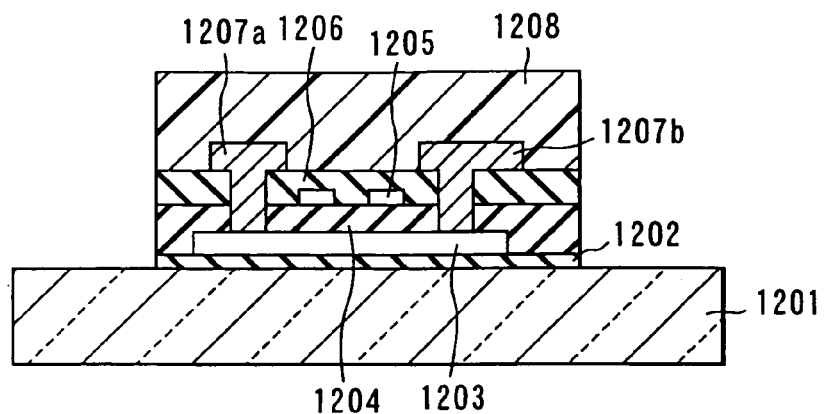
FIGS. 9A to 9C are sectional views to help explain a method of manufacturing an active matrix substrate according to the second embodiment.
Figure 9B:
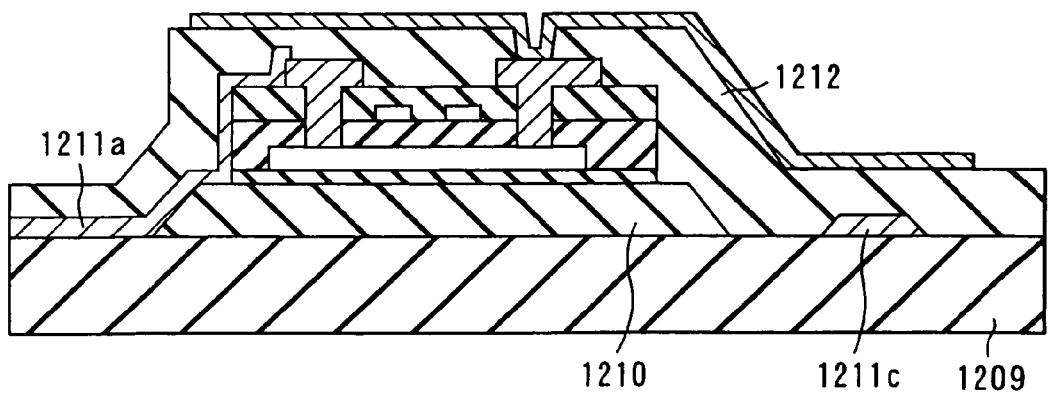
Figure 9C:
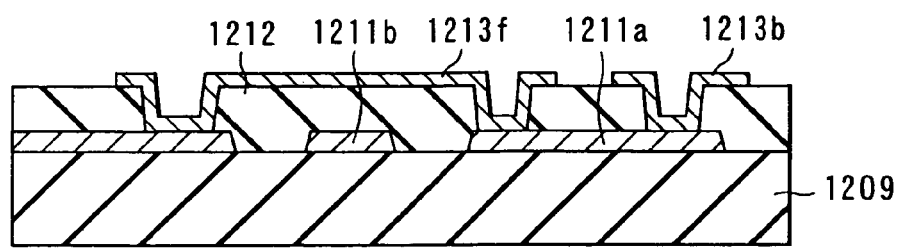

FIG. 8 is a schematic perspective plan view of an active matrix substrate according to a second embodiment of the present invention. FIGS. 9A to 9C are sectional views showing a sectional configuration of the active matrix substrate and its forming processes. FIGS. 9A and 9B are sectional views taken along line I—I of FIG. 8 and FIG. 9C is a sectional view taken along line II—II of FIG. 8.

The active matrix substrate of the second embodiment differs from that of the first embodiment in the processing of the thin-film transistors. Next, referring to those figures, the configuration of an active matrix of the second embodiment will be explained in terms of manufacturing process flow.

First, as shown in FIG. 9A, a thin-film transistor element is formed on an element formation substrate 1201. Specifically, on a highly heat-resistant glass substrate 1201, an undercoat layer 1202 is formed to a thickness of about 200 nm to 1 µm. A silicon oxide (SiOx) film or a silicon nitride (SiNx) film is used as the undercoat layer 1202, blocking ionic impurities from the thin-film transistor, which is desirable. Use of a stacked layer of those films would increase the effect further.

On the undercoat layer 1202, an amorphous silicon layer is deposited to a thickness of about 50 nm to 100 nm by CVD. Then, the amorphous silicon layer is made polycrystalline by excimer laser annealing or the like. The polycrystalline silicon layer obtained in this way is patterned, forming a channel layer 1203. In the polycrystalline silicon layer 1203, p-type impurities are doped.

Furthermore, an insulating film made of silicon oxide (SiOx) or the like is deposited to a thickness of about 100 nm to 300 nm, thereby forming a gate insulating layer 1204.

On the gate insulating layer, a metal layer of molybdenum tungsten (MoW), molybdenum tantalum (MoTa), or aluminum (Al) is deposited to a thickness of about 200 nm to 400 nm. The resulting layer is patterned to form a gate electrode 1205. In the polycrystalline silicon film 1203 making the source and drain regions on both sides of the gate electrode, n-type impurities are doped.

Next, an insulating film made of silicon oxide or the like is deposited to a thickness of about 200 nm to 1 µm, thereby forming an interlayer insulating layer 1206. Then, the interlayer insulating layer. 1206 and gate insulating layer 1204 are patterned so as to make through holes.

Next, a metal such as aluminum is deposited to a thickness of about 200 nm to 400 nm. The resulting layer is patterned, thereby forming a source electrode 1207a and a drain electrode 1207b.

Thereafter, a photoresist is applied. Then, with a mask, the resulting layer is exposed to ultraviolet rays, thereby forming a protective layer 1208 with a photoresist pattern to a thickness of about 2 μm to 10 μm. Furthermore, with the resist pattern as a mask, the interlayer insulating layer 1206, gate insulating layer 1204, and undercoat layer 1202 are etched, thereby separating the individual thin-film transistors. By the above processes, thin-film transistors having the configuration shown in FIG. 9A are obtained.

Thereafter, by the same processes as those in the first embodiment, the step of transferring the thin-film transistors to an intermediate transfer substrate and the step of selectively transferring the thin-film transistors to the final substrate are carried out, thereby transferring the thin-film transistors from the element formation substrate on which polycrystalline silicon thin-film transistors have been formed very densely to a plurality of final substrates, which forms an active matrix substrate shown in FIGS. 8, 9B, and 9C.

Specifically, the thin-film transistors are transferred via thick-film adhesive pads 1210 to a final substrate 1209. Furthermore, signal lines 1211a, gate lines 1211b, and storage capacitor lines 1211c are formed. On them, a passivation film 1212 is formed. On the passivation film 1212, pixel electrodes 1213a, signal-line pad electrodes 1213b, gate-line pad electrodes 1213c, storage capacitor line pad electrodes 1213d, cross junction metals 1213e for signal lines and gate lines and connection metals 1213f for signal lines and storage capacitor lines are formed.

In the second embodiment, thin-film transistors are made of polycrystalline silicon, which realizes a. thin-film transistor mobility 10 to 100 times lager than those made of amorphous silicon. As a result, the thin-film transistors can be made reduced in size, which makes it possible to form a higher-density thin-film transistor group on the element formation substrate 1201. Consequently, many active matrix substrates can be formed from a single thin-film transistor substrate (or element formation substrate), which further reduces the costs.

THIRD EMBODIMENT

Next, an active matrix substrate with a further improved sectional shape of a thick-film adhesive pad according to a third embodiment of the present invention will be explained.

Figure 10A:
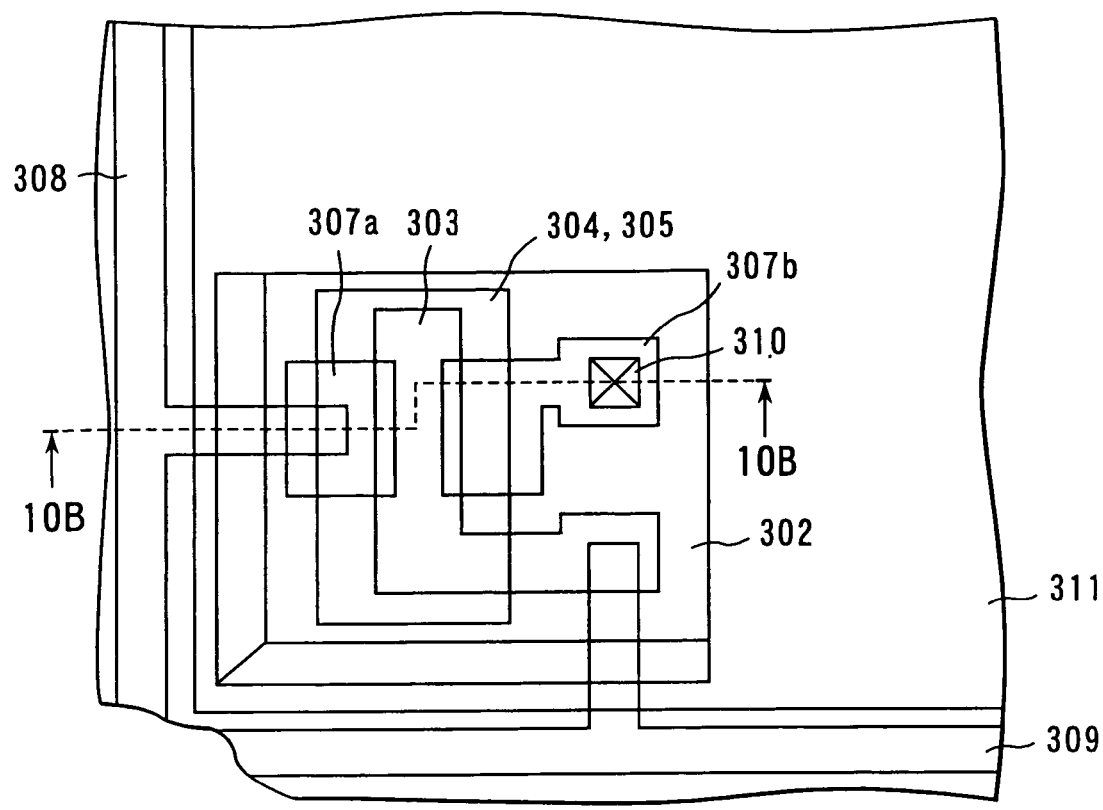
FIG. 10A is a schematic diagram showing a plan configuration of an active matrix substrate according to a third embodiment of the present invention.
Figure 10B:
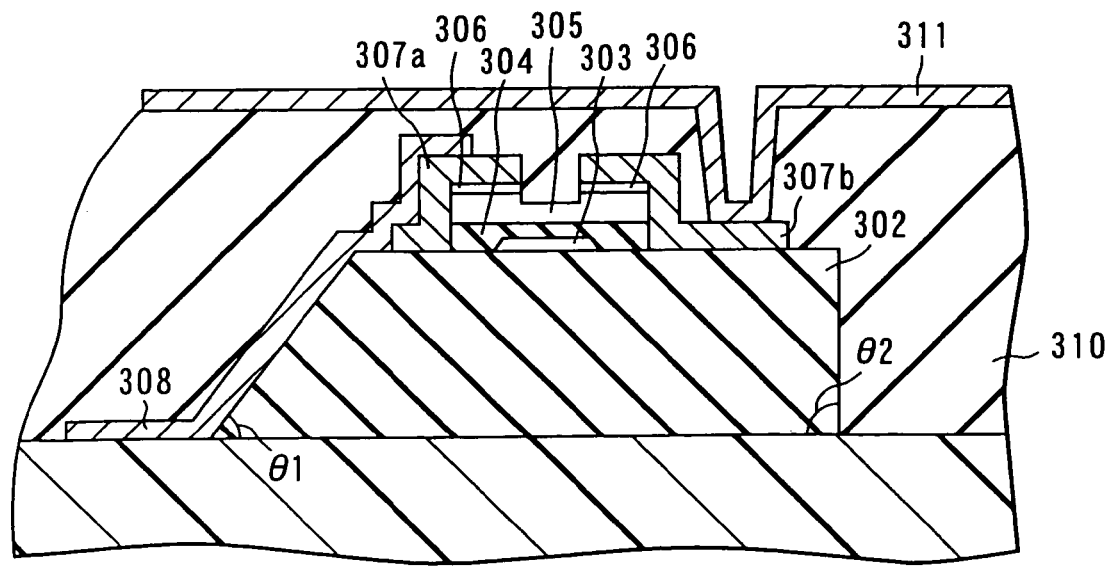
FIG. 10B is a sectional view taken along line 10B—10B of FIG. 10A.

FIG. 10A is a schematic diagram showing a plan structure of an active matrix substrate according to the third embodiment. FIG. 10B is a sectional view taken along line 10B—10B of FIG. 10A.

In the first and second embodiments, the contact angle of the side face on either side of each of the thick-film adhesive pads 213, 1210 is the same (θ1=θ2). In the third embodiment, however, the contact angles on the sides facing each other are made different from one another (θ1<θ2). Then, interconnection lines are formed on the gentle slope with a smaller contact angle.

Specifically, the interconnection line for the source electrode 307a of a thin-film transistor transferred onto a thick-film adhesion pad 302 and a signal line 308 and the interconnection line for a gate line 309 and a gate electrode 303 are formed on a gentle slope.

More specifically, as seen from FIGS. 10A and 10B, of the four side faces of the thick-film adhesive pad 302, the contact angle θ1 of the slope of each of the two sides is made smaller. The interconnection line for the signal line 308 and source electrode 307a is run along one slope and the interconnection line for the gate electrode 307b and gate line 309 is run along the other slope. The interconnection lines for the pixel electrode 311 and drain electrode 307b are prevented from running over the step of the thick-film adhesion pad 302 by forming pixels on the flat top surface of the passivation layer 310.

Furthermore, making the passivation layer 310 thicker than the thick-film adhesive pad 302 prevents the following problem: the step of the thick-film adhesive pad 302 is reflected on the surface of the passivation layer 310, causing a step breakage in the pixel electrode 311.

Figure 11A:
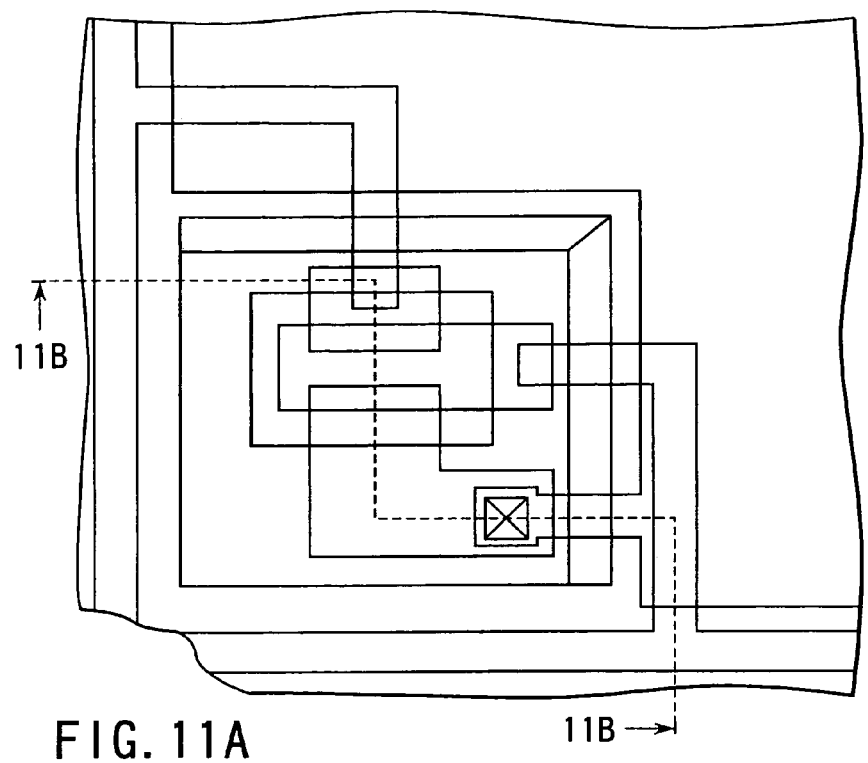
FIG. 11A is a schematic diagram showing a plan configuration of an active matrix substrate according to a modification of the third embodiment.
Figure 11B:
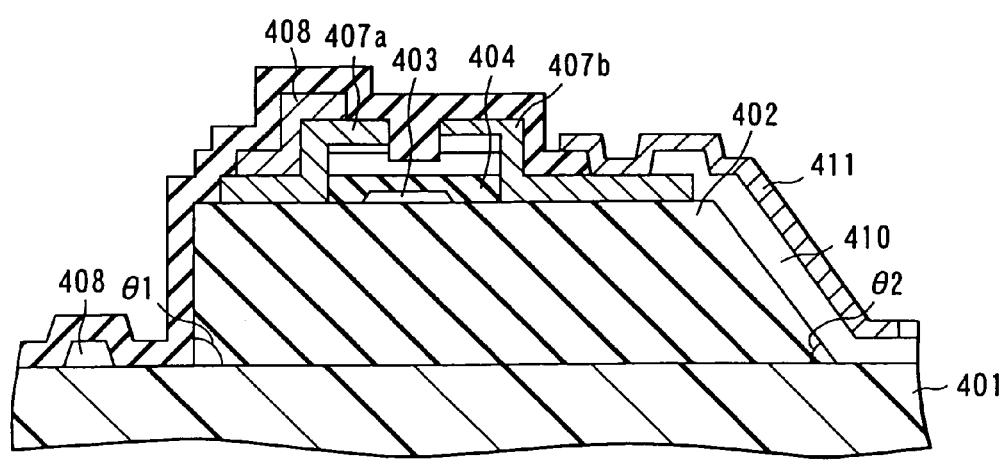
FIG. 11B is a sectional view taken along line 11B—11B of FIG. 11A.

FIGS. 11A and 11B show a modification of the third embodiment. FIG. 11A is a schematic diagram showing a plan configuration of an active matrix substrate. FIG. 11B is a sectional view taken along line 11B—11B of FIG. 11A.

The active matrix substrate has almost the same configuration as shown in FIGS. 10A and 10B, but differs in that the gentle slope of the side face of a thick-film adhesive pad 402 is provided on the pixel electrode side.

In the modification, the interconnection line for a pixel electrode 411 and a drain electrode 407b is also formed on the gentle slope of the thick-film adhesive pad. This solves the problem of the pixel electrode breaking at the step due to the step of the thick-film adhesive pad 402, even when the film thickness of the passivation film 410 is made smaller. Of course, the interconnection line for a signal line 408 and a source electrode 407a and the interconnection line for a gate line 409 and a gate electrode 403 are also formed on the gentle slope of the adhesion layer. This decreases the interconnection line breakage rate at the side face of the thick-film adhesive pad 402. The dependence of the breakage rate on the contact angle is almost the same as shown in FIG. 2.

Figure 12:
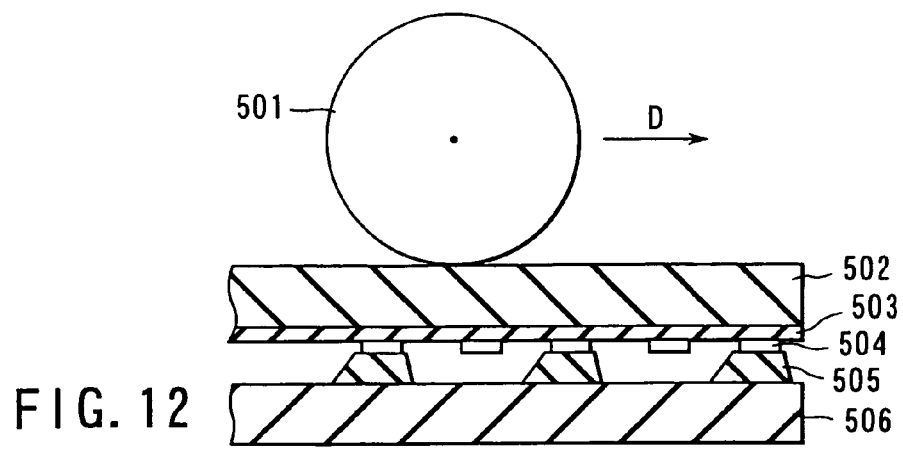
FIG. 12 is a schematic sectional view to help explain a method of transferring thin-film transistors from an intermediate transfer substrate to a final substrate with a roller.

In the third embodiment, a method of changing the slope of only one side face of each of the thick-film adhesive pads 302 and 402 is to press them in one direction with a roller. FIG. 12 is a conceptual diagram to help explain the process of transferring transistors from an intermediate transfer substrate 502 to a final substrate 506 by means of a roller. In this case, the inclination angle of the side face on the rear side with respect to the direction D in which the roller 501 is pressed and moved becomes smaller and the is inclination angle on the side on which the roller 501 advances becomes larger. In this method, it is possible to form a thick-film adhesive pad 505 with an asymmetrically inclined shape (the same holds true for thick-film adhesive pads 302 and 402).

In the third embodiment, a roller is caused to advance, while pressing in a direction along the diagonal of the thick-film adhesive pad 505 (302, 402) with an almost square or rectangular top face and bottom face, which makes the inclination angles of two of the four side faces smaller. Only one of the four side faces may be inclined by causing the roller to advance, with the roller pressed in the direction parallel to any one of the four side faces. In this case, too, forming interconnection lines on a side face with a smaller inclination angle produces the effect of decreasing the breakage rate.

Before the side face is deformed with the roller, the contact angle is in the range of about 40° to 80°. In the third embodiment, however, use of transfer processes with the roller decreases the contact angle of one of the two facing side faces to about 22° to 71°, with the top and bottom surfaces of the thick-film adhesive pad 505 (302, 402) being kept parallel. The other contact angle is formed up to about 90°. Interconnection lines are formed only on the gentle slops. This approach decreases the breakage ratio to about 20% at maximum.

With the third embodiment, only one side face of the thick-film adhesive pad can be made gentle without changing the area of each of the top and bottom faces of the thick-film adhesive pad 505 (302, 402). When a comparison is made using the same adhesion area, the side face of the thick-film adhesive pad on which interconnection lines are formed can be made gentler than in the first and second embodiments.

That is, setting the contact angle of a pair of side faces facing each other so as to meet the expression $\theta1<\theta2\leqq90°$ enables one slope on which interconnection lines are formed to be made gentler without changing the adhesion area. When $\theta2$ is set to 90°, this makes the opposite contact angle $\theta1$ the smallest.

The formation of an asymmetric contact angle in the third embodiment is not limited to a forming method using a roller as shown in FIG. 12. In short, a stress to shift the intermediate transfer substrate and the final substrate relatively in opposite directions has only to be applied. Such a stress may be applied to either the intermediate transfer substrate or the final substrate, or to both of them.

FOURTH EMBODIMENT

Next, an active matrix substrate according to a fourth embodiment of the present invention will be explained. In this active matrix substrate, not only a thin-film transistor element but also a thin-film interconnection line is formed on a thick-film adhesive pad, thereby preventing a step breakage.

Figure 13:
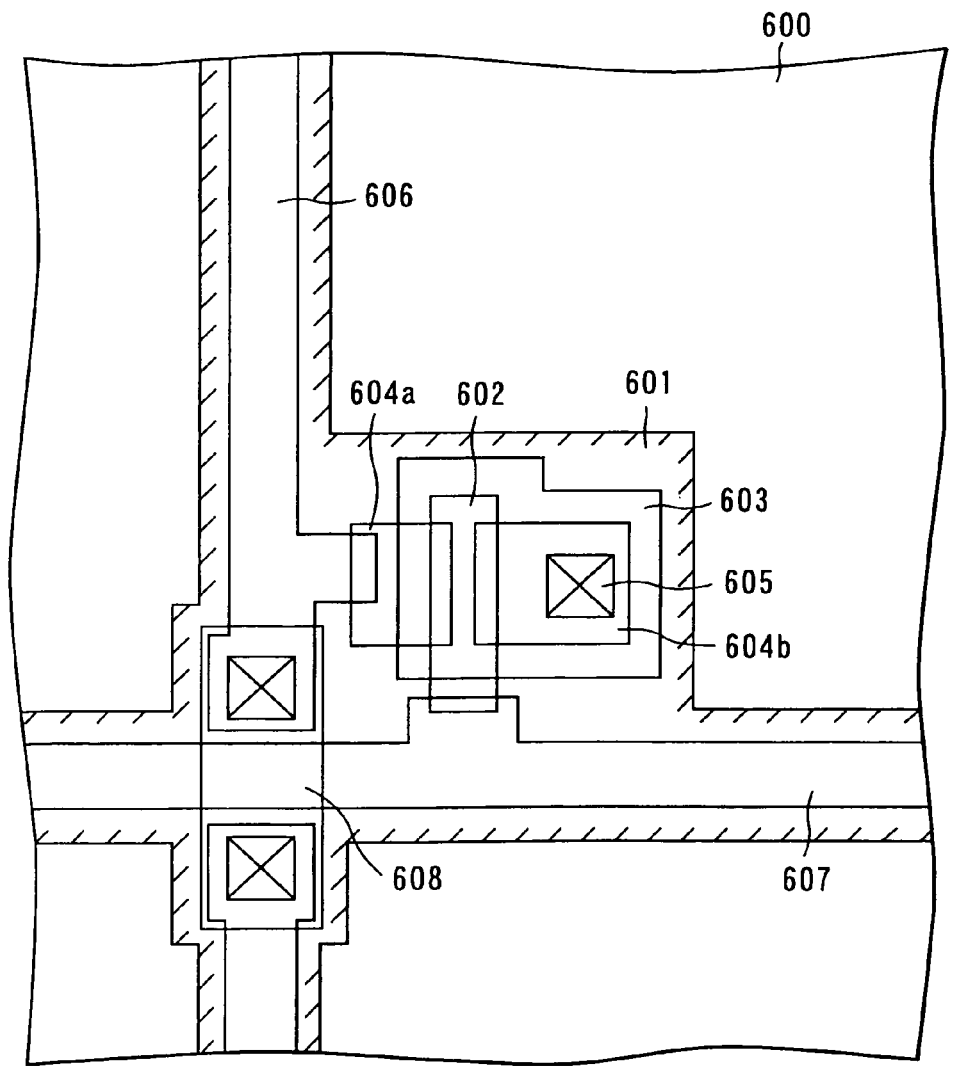
FIG. 13 is a schematic diagram showing a perspective plan configuration of an active matrix substrate according to a fourth embodiment of the present invention.

FIG. 13 is a schematic diagram showing a perspective plan configuration of an active matrix substrate according to the fourth embodiment. In the fourth embodiment, a grid-like thick-film adhesive pad 601 is formed on a substrate 600. On the pad, a channel layer 603 of a thin-film transistor is formed. For clarity, the borders of the thick-film adhesive pad 601 are hatched. The corners of the hatching parts may be rounded. Because no interconnection line is formed on the corners, the side faces may be vertical.

The thin-film transistor is provided with a gate electrode 602, a source electrode 604*a*, and a drain electrode 604*b*. The source electrode 604*a* is connected to a signal line 606 and the gate electrode 602 is connected to a gate line 607. The drain electrode 604*b* is connected through a contact hole 605 made in a passivation film to a pixel electrode (not shown) formed on the passivation film.

Then, in the fourth embodiment, not only the thin-film transistor element but also the gate line 607 and signal line 606 connected to the thin-film transistor are formed on the thick-film adhesive pad 601. Forming the thick-film adhesive pad 601 this way enables all of the thin-film transistor element, signal line 606, and gate line 607 to be arranged on the same face. That is, there is no step between those elements, which almost completely prevents breakage of the thin-film interconnection line connecting the signal line 606 and the source electrode 604, and the thin-film interconnection line connecting the gate line 607 and the gate electrode 604*b*.

Furthermore, according to the fourth embodiment, the thick-film adhesive pad 601 under the thin-film interconnection lines (signal line 606 and gate line 607) acts as a spacer. Therefore, even when the element formation substrate is flexible, however high the pressure is applied during transfer, the thin-film transistors not to be transferred will not come into contact with the final substrate unless the thick-film adhesive pad 601 itself has collapsed. This improves the yield in selective transfer.

As described above, with the fourth embodiment, the elimination of the steps in the thick-film adhesive pads prevents the breakage of the thin-film interconnection lines. On the other hand, care should be taken to prevent thin-film transistors not to be transferred from being transferred to the thick-film adhesive pads newly provided under the thin-film interconnection lines. That is, as described in FIGS. 3A to 3E, squeezing thin-film transistors with the highest density possible on the element formation substrate or intermediate transfer substrate improves the efficiency. However, when thick-film adhesive pads 601 are provided even under the thin-film interconnection lines, there is a possibility that even the thin-film transistors not to be transferred will be transferred to the thick-film adhesive pads for interconnection lines.

To solve this problem, the present inventors invented an arrangement of thin-film transistors on an element formation substrate or an intermediate substrate and decided the order in which thin-film transistors are transferred from the substrate.

Figure 14A:
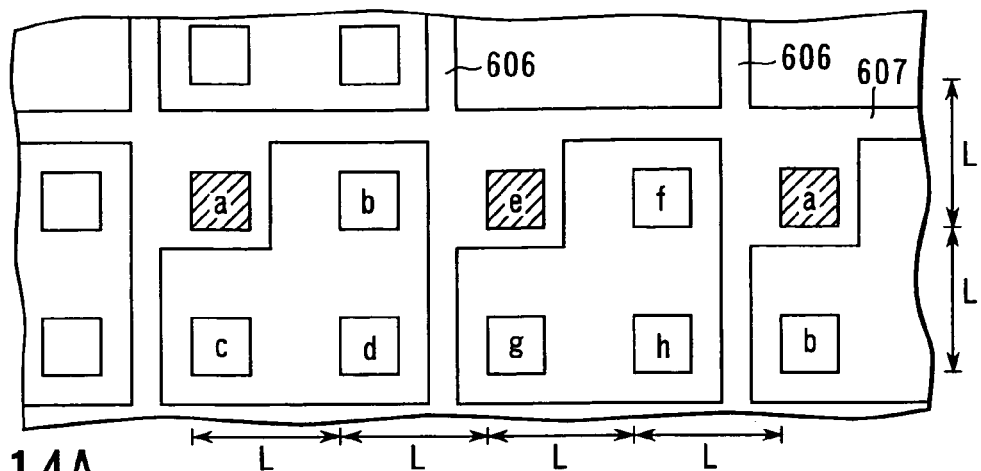
FIGS. 14A to 14D are conceptual diagrams to help explain the arrangement of thin-film transistors and the order of transfer in the fourth embodiment.
Figure 14B:
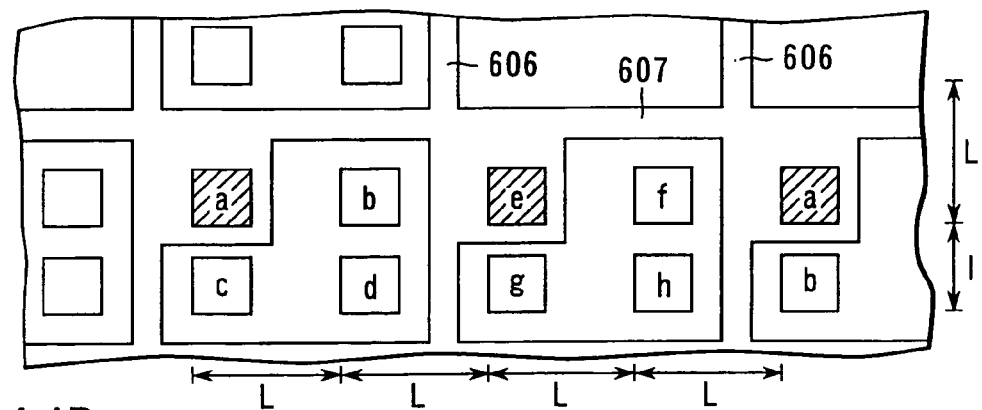
Figure 14C:
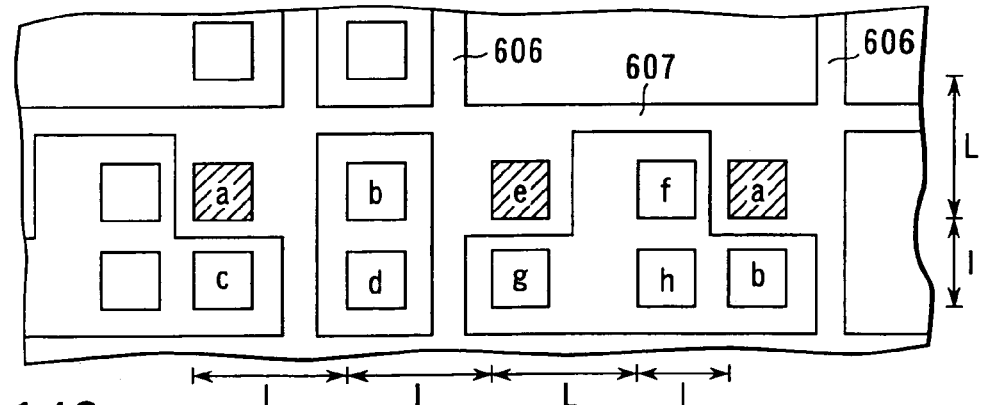

FIGS. 14A to 14D are conceptual diagrams to help explain the arrangement of thin-film transistors and the order of transfer in the fourth embodiment. Specifically, FIGS. 14A to 14C are conceptual diagrams showing the arrangement of thin-film transistor elements on an element formation substrate and the arrangement of signal lines 606 and gate lines 607 on a final substrate in an overlapping manner.

For the sake of simplification, an explanation will be given about a case where thin-film transistors are transferred from an element formation substrate or an intermediate transfer substrate on which four transistors are formed in each pixel area of an active matrix to four final substrates.

Figure 14D:
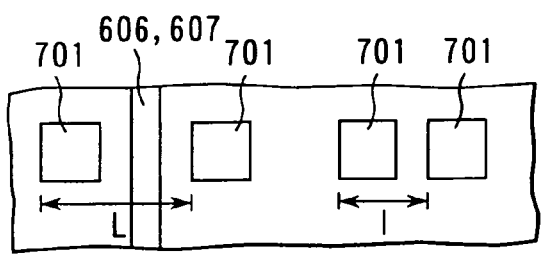

As shown in FIG. 14D, let the alignment pitch with no interconnection line between thin-film transistors 701 (at right in the figure) be 1 and the alignment pitch with an interconnection line 606, 607 crossed over (at left in the figure) be L. These pitches are assumed to remain unchanged in the signal line direction or the gate line direction.

In the fourth embodiment, when thick-film adhesive pads (not shown) are provided even under the thick-film interconnection lines, it is necessary to add the width of the thick-film adhesive pad at the interconnection line part to the pitch of thin-film transistors to prevent the element 701 from adhering to the thick-film adhesive pad. Therefore, the expression L>1 holds.

For further simplification, thin-film transistor elements 701 are arranged in the signal line direction and in the gate line direction on the element formation substrate with the pitch L obtained by adding the width of the interconnection line.

With this arrangement, even if the thin-film transistor elements 701 are selectively transferred in any order, the elements 701 will not adhere to the thick-film adhesive pads at the interconnection line parts, provided that the thick-film adhesive pads are aligned with the elements 701. In this case, the pitch of elements on the element formation substrate is L.

For example, element a and element e may be selectively transferred to a first final substrate, element b and element f may be selectively transferred to a second final substrate, element c and element g may be selectively transferred to a third final substrate, and element d and element may be selectively transferred to a fourth final substrate. In addition, the elements 701 may be selected in any other order and transferred to final substrates.

This method is excellent in selective transfer. While in the embodiment, the number of elements 701 is four, the number of elements 701 may be increased arbitrarily in the gate line direction and in the signal line direction.

Next, to improve the arrangement density of the elements 701 further, they may be arranged as shown in FIG. 14B. In this case, the pitch in the gate line direction is L as in FIG. 14A, but the pitch in the signal line direction takes two values: L and 1. Calculating the average of them gives (L+1)/2, which is a shorter pitch than in the case of FIG. 14A. Therefore, the degree of integration of elements on a transfer substrate can be increased.

In this case, too, when the elements 701 are selected in a suitable order, the transistor elements will not adhere to the thick-film adhesive pads at the interconnection line parts. Specifically, the elements 701 are transferred in the following order: element a and element e are transferred to a first final substrate, element d and element f are transferred to a second final substrate, element c and element g are transferred to a third final substrate, and element d and element h are transferred to a fourth final substrate. There is no limit to the number of elements, as in FIG. 14A.

FIG. 14C shows a concrete example of further improving the integration density of elements. In this case, the average pitch in the signal line direction is (L+1)/2 as in FIG. 14B, but the arrangement in the gate-line direction is improved to make the pitch shorter. Specifically, as shown in FIG. 14C, changing the arrangement pattern of interconnection lines 606 on an active matrix substrate causes one pitch between sets of four elements 701 to be decreased to 1. With the pitch 1, interconnection lines are not taken into consideration. In this case, the average pitch is (3L+1)/4.

With this arrangement, element a and element e are transferred to a first final substrate, element b and element f are transferred to a second final substrate, element c and element g are transferred to a third final substrate, and element d and element h are transferred to a fourth final substrate in this order, which prevents the elements from adhering to the thick-film adhesive pads at the interconnection line parts during the transfer. In the case of FIG. 14C, the number of sets of elements whose pitch in the direction of the gate line 607 can be decreased to 1 is limited to one. There is no limit to the number of elements in the direction of the signal line 606.

In this case, the pitch of lines 606 differs from the pitch of lines 607. However, the difference in pitch does not become a big problem, since those interconnection lines may be provided anywhere when the pixel electrodes are put on the thin-film transistors.

Figure 15A:
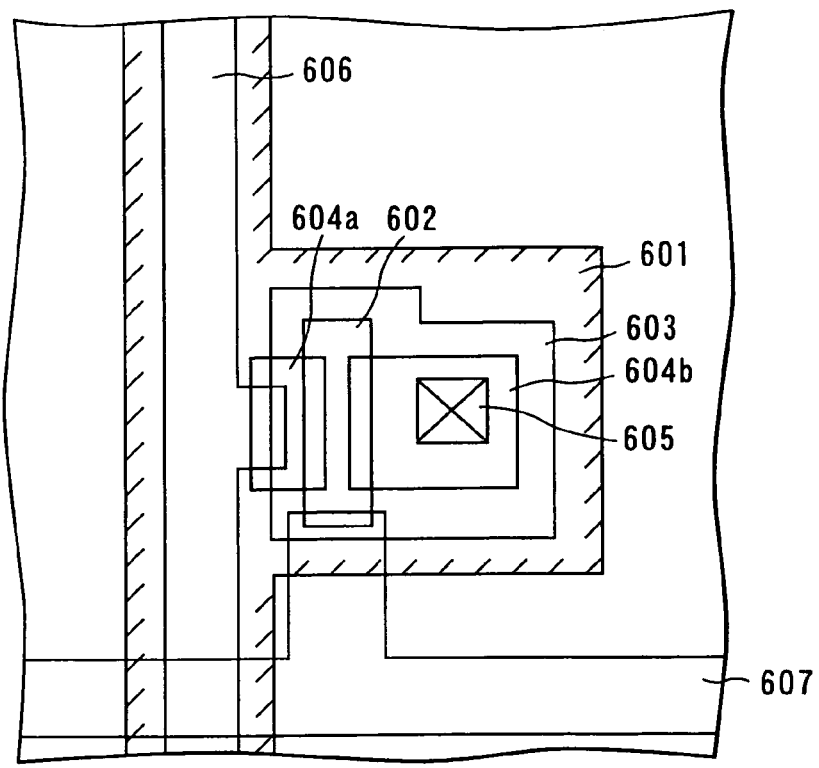
FIGS. 15A and 15B are perspective plan views showing modifications of thick-film adhesion pad formation in the active matrix substrate of the fourth embodiment.
Figure 15B:
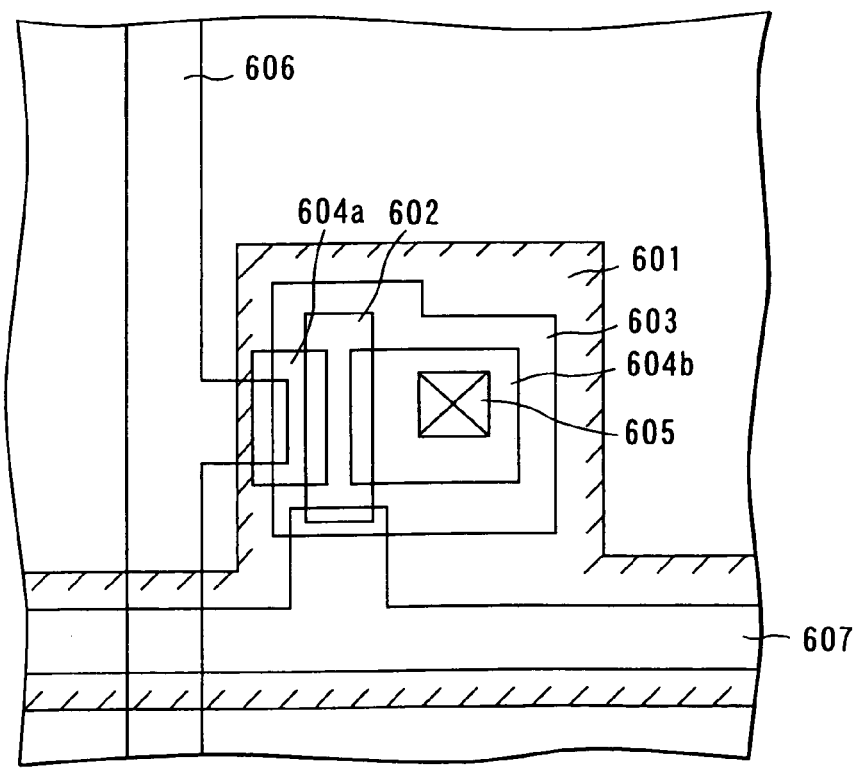

FIGS. 15A and 15B are perspective plan views showing examples of another pattern formation of thick-film adhesion pads on the active matrix substrate of the fourth embodiment. In the figures, the same parts as those in FIG. 13 are indicated by the same reference numerals and a detailed explanation of them is omitted.

While in the active matrix substrate of FIG. 13, the thick-film adhesive pads 601 are provided under both the signal lines 606 and the gate lines 607, the thick-film adhesive pads 601 may be formed only under the signal lines 606 as shown in FIG. 15A. Alternatively, the thick-film adhesive pads 601 may be formed only under the gate lines 607 as shown in FIG. 15B. In FIGS. 15A and 15B, too, the borders of the thick-film adhesive pad 601 are hatched for clarity.

In FIG. 15A, the thin-film interconnection line for the signal line 606 and source electrode 604a is prevented from breaking. In FIG. 15B, the thin-film interconnection line for the gate line 607 and gate electrode 604b is prevented from breaking. Use of the thick-film adhesive pad pattern as shown in FIG. 15A causes only the signal line 606 to be placed flush with the thin-film transistor. Use of the thick-film adhesive pad pattern as shown in FIG. 15B causes only the gate line 607 to be placed flush with the thin-film transistor. The other interconnection lines are formed in such a manner that they cross over the step at the side face of the thick-film adhesive pad 601. In this case, the breaking of the lines can be prevented by giving a desired contact angle to the side face of the thick-film adhesive pad 601 as described in the first embodiment. Furthermore, when the thick-film adhesive pads 601 are provided so as to correspond only to either the vertical interconnection lines or the horizontal interconnection lines, this eliminates the limit in the other direction (in the gate line direction in FIG. 15A or in the signal line in FIG. 15B) to the element arrangement resulting from the aforementioned thick-film adhesive pad pattern in FIGS. 14A to 14D. Therefore, a much higher-density element arrangement can be realized on an element formation substrate than in the embodiment of FIGS. 14A to 14D.

FIFTH EMBODIMENT

Next, an active matrix substrate where a plurality of thin-film transistor elements are provided on a single thick-film adhesive pad according to a fifth embodiment of the present invention will be explained.

Figure 16:
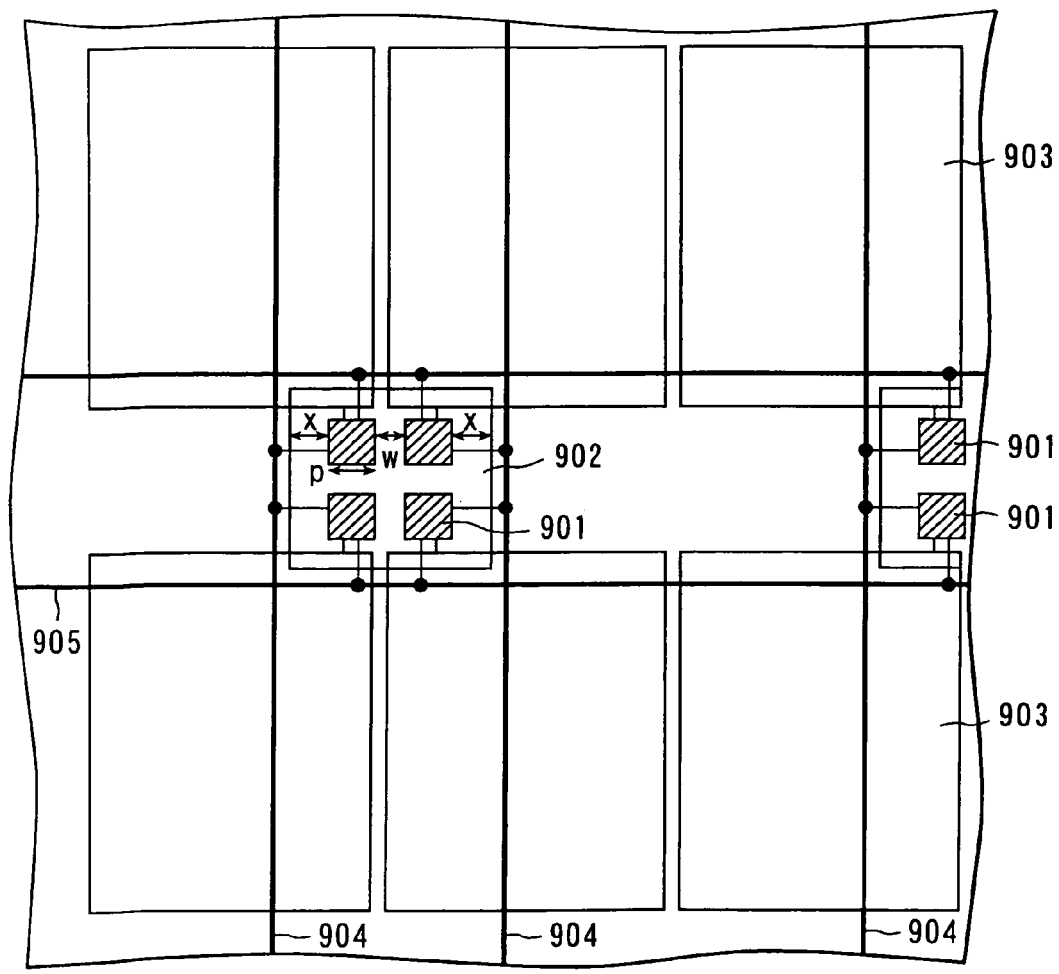
FIG. 16 is a conceptual diagram showing a plan configuration of an active matrix substrate according to a fifth embodiment of the present invention.
Figure 17:
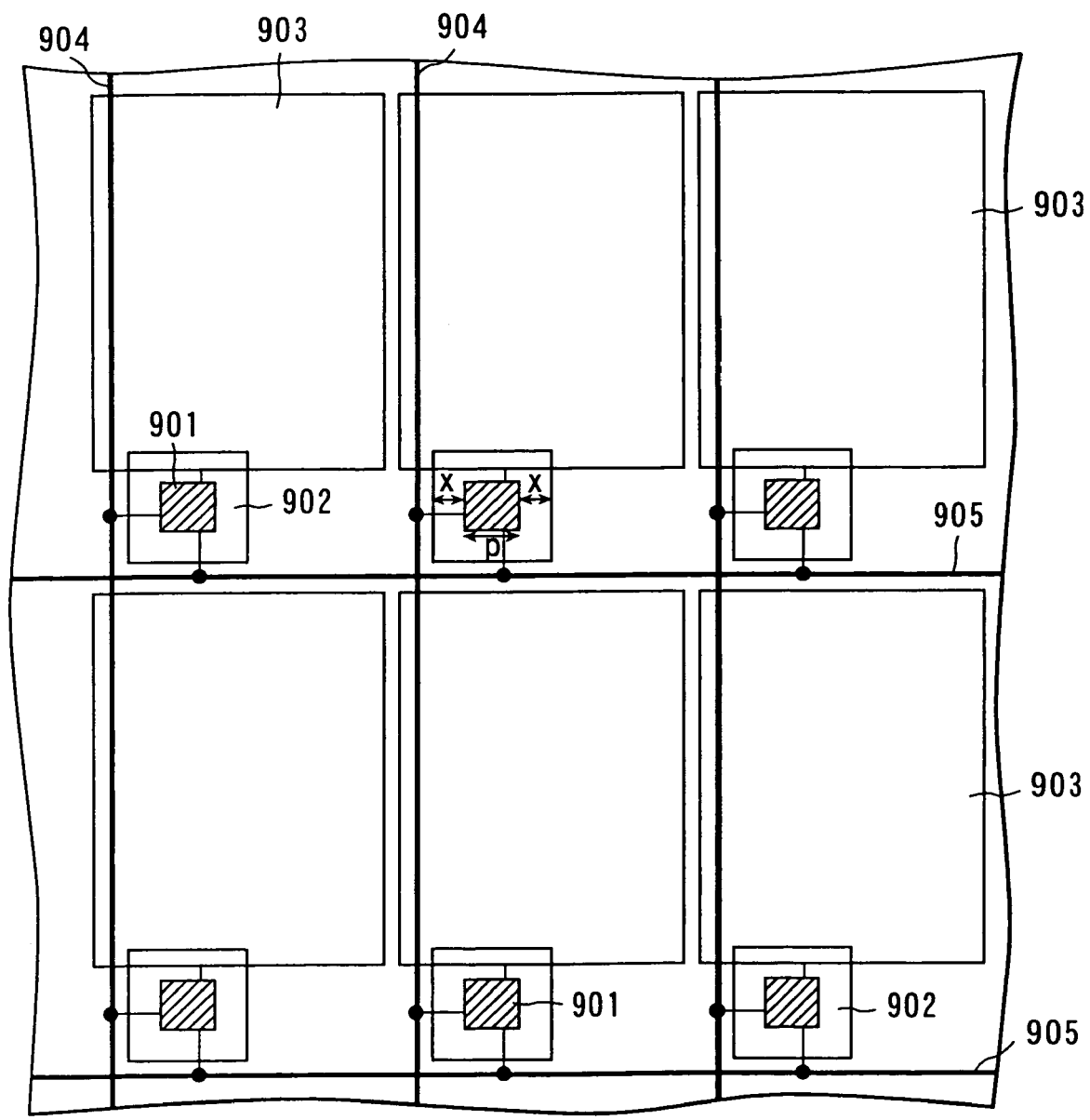
FIG. 17 is a conceptual diagram showing a plan configuration of an ordinary active matrix substrate for comparison.

FIG. 16 is a conceptual diagram showing a plan configuration of an active matrix substrate according to the fifth embodiment. FIG. 17 is a conceptual diagram showing a plan configuration of an ordinary active matrix substrate for comparison.

In the configuration explained above, a thick-film adhesive pad 902 is provided for a pixel 903. On the pad 902, a thin-film transistor 901 is placed. In the fifth embodiment, however, a plurality of thin-film transistors are provided on a thick-film adhesive pad. For example, in the embodiment shown in FIG. 16, a thick-film adhesive pad 902 is provided for four pixels 903. On the pad 902, four thin-film transistors 901 are provided.

Generally, when the size of the thick-film adhesive pad is determined, it is necessary to add a margin so that thin-film transistors may not stick out from the pad. The margin is represented by x in FIGS. 16 and 17.

In the configuration of FIG. 17, the margin x is needed on both sides of a thin-film transistor. Therefore, if the size of a thin-film transistor is p, the width of the thick-film adhesive pad 902 has to be (2x+p). That is, if the thick-film adhesive pad 902 and the thin-film transistor 901 are square, the area of the thick-film adhesive pad 902 is about $(2x+p)^2$.

On the other hand, in the configuration of FIG. 16, only one side of the thin-film transistor 901 can stick out from the edge of the thick-film adhesive pad 902. If the margin between elements is w, the width of the thick-film adhesive pad 902 is (2x+2p+w). Since a plurality of thin-film transistors transferred to the same thick-film adhesive pad can be formed integrally and transferred simultaneously (or squeezed into one chip), the margin between elements can be designed to be practically 0.

Therefore, the width of the thick-film adhesive pad 90 is (2x+2p). The adhesive pad width per transistor is (x+p) and the area of an adhesive pad per thin-film transistor is about $(x+p)^2$.

In the fifth embodiment, as compared with FIG. 17, the thick-film adhesive pad 902 can be formed in an area as small as about $\{(x+p)/(2x+p)\}^2$. This means that the degree of integration of thin-film transistors on an element formation substrate can be increased more. Therefore, many thin-film transistor array substrates can be formed from a single element formation substrate, which reduces the costs.

Figure 18:
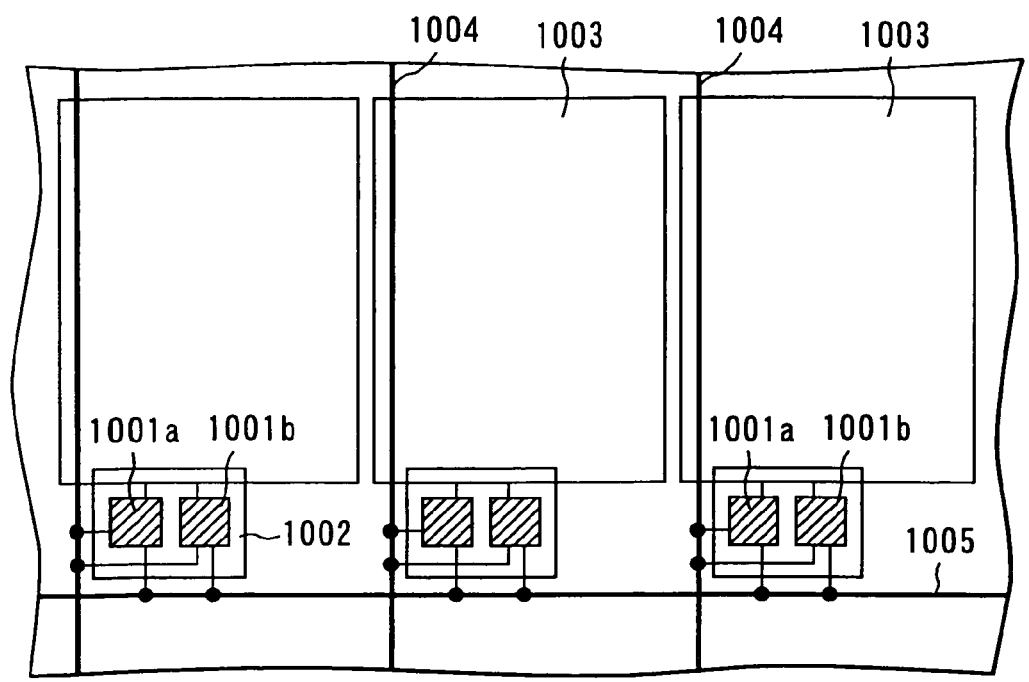
FIG. 18 is a plan view showing an active matrix substrate where two thin-film transistors are arranged on a single thick-film adhesive pad.

Furthermore, a plurality of thin-film transistors 901 are arranged on a thick-film adhesive pad 902 and are connected in parallel between signal lines and between pixel electrodes. In FIGS. 17 and 18, numeral 903 indicates a pixel electrode, 904 a signal line, and 905 a gate line.

FIG. 18 is a plan view of an active matrix substrate where two thin-film transistors 1001a, 1001b are provided on a thick-film adhesive pad 1002. In this way, connecting a plurality of thin-film transistors in parallel with pixel electrodes 1003 enables the other thin-film transistor to write charge into the pixel electrode 1003, even when one of the two thin-film transistors is not transferred in a transfer process, or when the electrical characteristics deteriorate due to damage in transfer.

Furthermore, a plurality of transistors may be connected in series on a thick-film adhesive pad. In this case, the off resistance of thin-film transistors can be increased, which produces the effect of decreasing a leakage current from the pixel electrode to the thin-film transistor in the off state.

Figure 19:
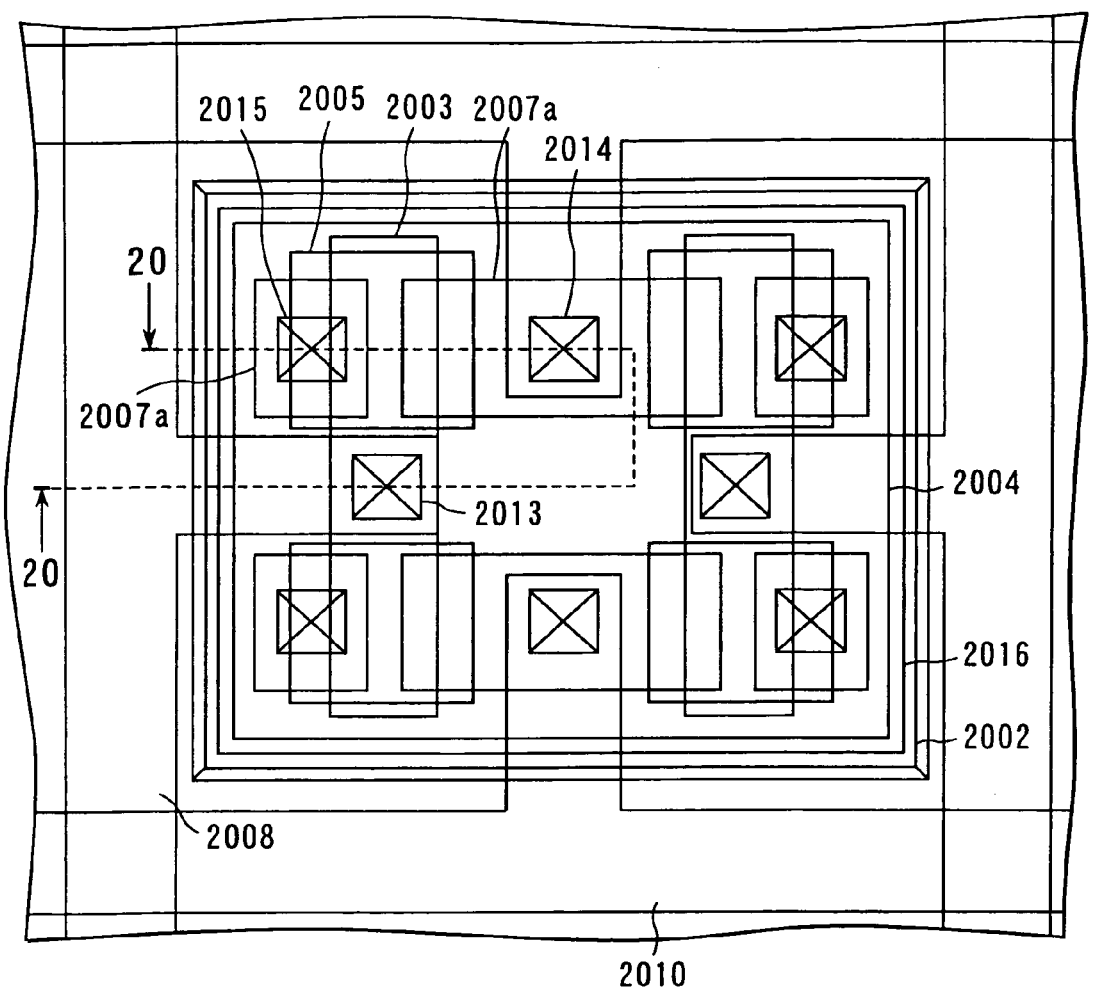
FIG. 19 is a plan view of a thin-film transistor, a concrete embodiment of the configuration of FIG. 16.
Figure 20:
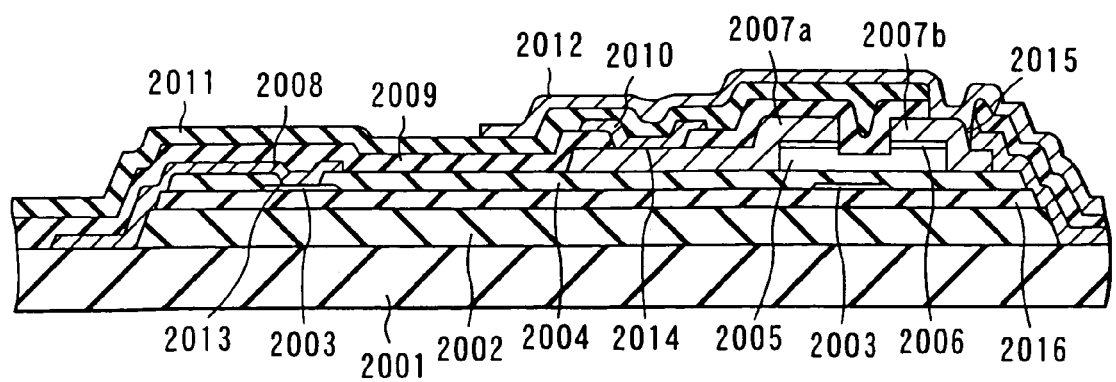
FIG. 20 is a sectional view taken along line 20—20 of FIG. 19.

FIG. 19 is a plan view of four thin-film transistors formed integrally on a thick-film adhesive pad 2002, showing a concrete embodiment of the configuration of FIG. 16. FIG. 20 is a sectional view taken along line 20—20 of FIG. 19.

In the fifth embodiment, a thick-film adhesive pad 2002 is formed on a substrate 2001. On the pad, a thin-film transistor is formed which is made up of an undercoat layer 2016, gate electrodes 2003, a gate insulating film 2004, a channel layer 2005, a n-type semiconductor layer 2006, a source electrode 2007a, and a drain electrode 2007b. The gate electrode 2003 of the thin-film transistor is connected to a gate line 2008 through a first through hole 2013 made in the gate insulating film 2004.

The source electrode 2007a is connected to a signal line 2010 through a second through hole 2014 made in a first passivation layer 2009. A pixel electrode 2012 is connected to the drain electrode 2007b through a third through hole 2015 made in the first passivation layer 2009 and a second passivation layer 2011.

In the fifth embodiment, four thin-film transistors made of the above-described components are formed on the thick-film adhesive pad 2002. This configuration is characterized in that adjacent source electrodes and gate electrodes share through holes (contacts) to decrease the number of through holes. Specifically, in an ordinary independent thin-film transistor, a single transistor requires three contacts: a gate electrode contact, a signal-line electrode contact, and a pixel electrode contact. Thus, when four transistors are simply arranged side by side, a total of 12 through holes (contacts) are needed.

With the fifth embodiment, however, electrodes connected to common interconnection lines are connected via common through holes, which decreases the number of through holes (contacts). That is, with the configuration of FIG. 19, eight through holes (contacts) are needed for four transistors, which reduces the number of through holes (contacts) per transistor to two.

In this way, the area necessary for the arrangement of through holes (contacts) can be decreased remarkably. That is, forming a plurality of thin-film transistors on a thick-film adhesive pad realizes a higher density with a design margin.

In addition, sharing through holes (contacts) to reduce the number of the through holes as in the fifth embodiment enables the area occupied by a single thin-film transistor to be decreased, which makes it possible to form thin-film transistors much more densely.

While in the fifth embodiment, a gate electrode and a source electrode adjacent to each other are connected through a through hole (a contact), another configuration may be used. For instance, only the gate electrodes of adjacent thin-film transistors may be put together and drawn via a through hole (a contact) and the source electrodes may be drawn via independent through holes (contacts). Conversely, only the source electrodes of adjacent thin-film transistors may be put together and drawn via a through hole (a contact) and the gate electrodes may be drawn via independent through holes (contacts).

The fifth embodiment may be combined with the first to fourth embodiments. Specifically, as in the first to third embodiments, giving a desired contact angle to the side face of the thick-film adhesive pad prevents breakage of the thin-film interconnection lines resulting from a step breakage. As in the fourth embodiment, providing matrix interconnection lines, including signal lines and gate lines, on the thick-film adhesive pads makes these lines flush with the thin-film transistors, which prevents breakage of the interconnection lines caused by steps.

The present invention is not limited to the first to fifth embodiments. For instance, an active matrix substrate of the present invention is not restricted to a liquid-crystal display device and may be applied to various types of display devices that need the switching of each pixel.

Figure 21:
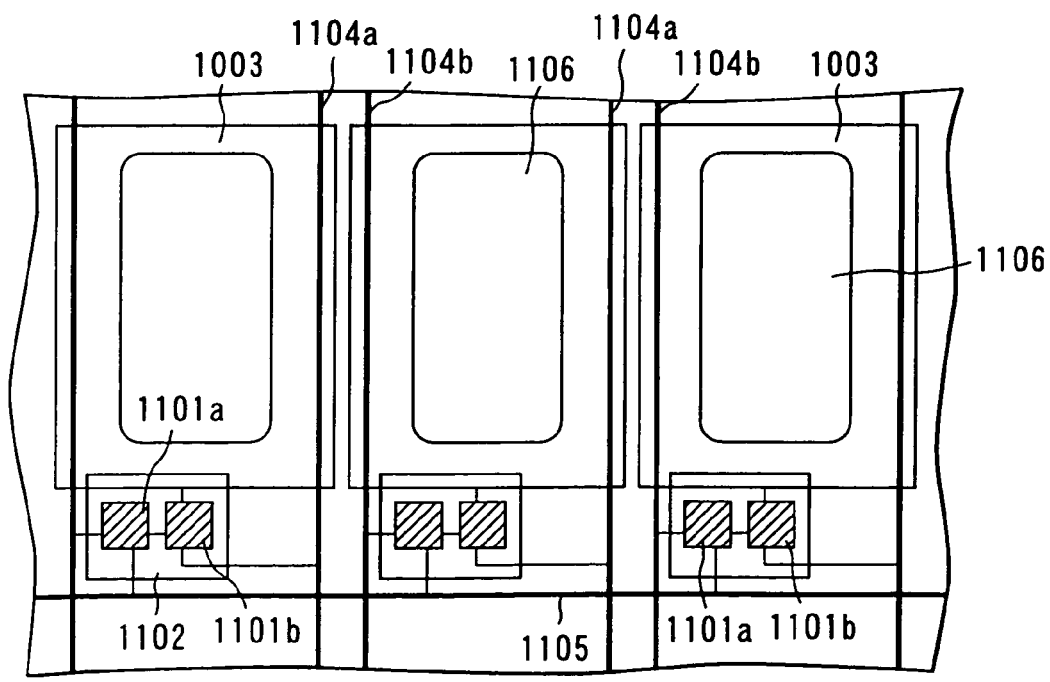
FIG. 21 is a schematic plan view showing an embodiment of applying EL display elements to the fifth embodiment.

FIG. 21 is a conceptual diagram showing a plan configuration of the main part of a modification where the present invention is applied to an EL display device. In this modification, two thin-film transistors 1101a and 1101b are provided on a thick-film adhesive pad 1102. The gate electrode of a first thin-film transistor 1101a is connected to a gate line 1105 and its source electrode is connected a first signal line 1104a. The gate electrode of a second thin-film transistor 1101b is connected to the drain electrode of the first thin-film transistor and its source electrode is connected to a power line 1104b. Its drain electrode is connected to a pixel electrode 1103. Then, an organic EL light-emitting element 1106 is formed on a pixel electrode 1103.

In the pixel, to cause the organic EL light-emitting element 1106 to emit light, a signal is applied to the gate line 1105 with specific timing, thereby turning on the first thin-film transistor 1101a, causing the signal line 1104a to apply a voltage to the gate electrode of the second thin-film transistor 1101b. As a result, the power line 1104b supplies current via the second thin-film transistor 1101b and the pixel electrode 1103 to the organic EL part 1106. This causes the organic EL part 1106 to emit light.

In the modification, since the organic EL element 1106 is used as a display element, it is possible to provide, at low cost, a more flexible, lighter display device capable of displaying brighter images than a liquid-crystal display device.

Furthermore, in the modification, too, as in the first to third embodiments, giving a desired contact angle to the side face of the thick-film adhesive pad prevents breakage of the thin-film interconnection lines resulting from a step breakage. As in the fourth embodiment, providing matrix interconnection lines, including signal lines and gate lines, on the thick-film adhesive pads makes these lines flush with the thin-film transistors, which prevents breakage of the interconnection lines caused by steps.

Liquid-crystal display devices and an EL display device have been explained as examples of a display device of the invention. In addition to these, display devices of the invention include all other display devices that need various types of pixel switching, including an LED (Light Emitting Diode) display.

As described in detail, with the present invention, it is possible to form thin-film transistors with excellent characteristics on a plurality of final substrates by simple transfer processes with a good yield. Consequently, a thin-film transistor array with few characteristic defects can be formed on a flexible substrate, such as a plastic substrate, at low cost, with the result that a light, flexible display device which has few display defects and provides a good picture quality can be provided at a low price, which offers great industrial advantages.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An active matrix substrate comprising:
   a substrate with a main face;
   a thick-film adhesive pad provided on the main face of the substrate and including a side face at least at a part thereof inclined at a first contact angle smaller than 90 degrees to the main face;
   a thin-film active element provided on the thick-film adhesive pad; and
   a thin-film interconnection line connected to the thin-film active element and extending onto the substrate via the part of the side face.

2. The active matrix substrate according to claim 1, wherein a second contact angle to the main face of the substrate at a part of a side face opposite to the inclined part of the side face of the thick-film adhesive pad is larger than the first contact angle of the inclined part.

3. The active matrix substrate according to claim 1, wherein the first contact angle is equal to or larger than 40 degrees and equal to or smaller than 80 degrees.

4. The active matrix substrate according to claim 1, wherein a thickness of the thick-film adhesive pad is ranged from 1 to 10 µm.

5. The active matrix substrate according to claim 1, wherein a thickness of the thin-film interconnection line is ranged from 0.2 to 0.5 µm.

6. The active matrix substrate according to claim 1, wherein the thin-film active element includes a plurality of sub-active elements with a plurality of electrodes.

7. The active matrix substrate according to claim 6, wherein at least one of the plurality of electrodes of the plurality of sub-active elements is shared by at least two of the plurality of sub-active elements.

8. The active matrix substrate according to claim 7, wherein the at least one electrode shared is connected to the thin-film interconnection line via common contact.

9. The active matrix substrate according to claim 1, wherein the thick-film adhesive pad is made from an adhesive organic resin such as acrylic resin.

10. The active matrix substrate according to claim 1, wherein the substrate is a plastic substrate or a flexible substrate.

11. The active matrix substrate according to claim 10, wherein the plastic substrate or the flexible substrate is made from a material selected from the group consisting of polyether-ether-ketone, polyethylene naphthalate, polyether sulfone, and polyimide.

12. A display device comprising:
   an active matrix substrate according to claim 1; and
   a plurality of display cells formed on the active matrix substrate, each of the plurality of display cells being controlled in operation by the thin-film active element provided on the active matrix substrate.

13. The display device according to claim 12, wherein the display cells include one kind of cells selected from the group consisting of liquid-crystal display cells and organic EL cells.

* * * * *